(12) United States Patent
Takeya et al.

(10) Patent No.: US 10,833,057 B2
(45) Date of Patent: Nov. 10, 2020

(54) DISPLAY APPARATUS AND MANUFACTURING METHOD THEREOF

(71) Applicant: Seoul Semiconductor Co., Ltd., Ansan-si (KR)

(72) Inventors: Motonobu Takeya, Ansan-si (KR); Young Hyun Kim, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 16/285,692

(22) Filed: Feb. 26, 2019

(65) Prior Publication Data

US 2019/0206851 A1    Jul. 4, 2019

Related U.S. Application Data

(63) Continuation of application No. 15/851,718, filed on Dec. 21, 2017, now Pat. No. 10,312,225, which is a
(Continued)

(51) Int. Cl.
*H01L 25/16* (2006.01)
*H05B 33/12* (2006.01)
(Continued)

(52) U.S. Cl.
CPC ........ *H01L 25/167* (2013.01); *H01L 21/6835* (2013.01); *H01L 24/19* (2013.01);
(Continued)

(58) Field of Classification Search
CPC ... H01L 25/167; H01L 25/0753; H01L 24/19; H01L 24/97; H01L 21/6835;
(Continued)

(56) References Cited

U.S. PATENT DOCUMENTS 8,426,227 B1    4/2013    Bibl et al.
9,899,418 B2    2/2018    Pfeuffer et al.
(Continued)

FOREIGN PATENT DOCUMENTS

DE    102012112302    6/2014
JP    10-98076    4/1998
(Continued)

OTHER PUBLICATIONS

Search Report dated Mar. 29, 2019 issued in European Patent Application No. 16828068.
(Continued)

*Primary Examiner* — Patricia D Reddington
(74) *Attorney, Agent, or Firm* — H.C. Park & Associates, PLC

(57) ABSTRACT

A display apparatus includes: a transparent substrate; a panel substrate; a light emitting diode disposed between the transparent substrate and the panel substrate; an insulation layer covering side surfaces of the light emitting diode; a first connection electrode electrically connected to the light emitting diode and disposed on the insulation layer between the insulation layer and the panel substrate; a second connection electrode on the panel substrate; and an electrode connector electrically connecting the first connection electrode to the second connection electrode, wherein the first connection electrode has an overlapping portion overlapping with the light emitting diode and a non-overlapping portion laterally extending from the overlapping portion on the insulation layer.

20 Claims, 21 Drawing Sheets

Related U.S. Application Data continuation of application No. 15/218,514, filed on Jul. 25, 2016, now Pat. No. 9,887,184.

(60) Provisional application No. 62/267,770, filed on Dec. 15, 2015.

(51) Int. Cl.

| | |
|---|---|
| *H01L 23/00* | (2006.01) |
| *H01L 21/683* | (2006.01) |
| *H05B 33/14* | (2006.01) |
| *H01L 33/00* | (2010.01) |
| *H01L 25/075* | (2006.01) |
| *H01L 27/12* | (2006.01) |
| *H01L 33/06* | (2010.01) |
| *H01L 33/32* | (2010.01) |
| *H01L 33/38* | (2010.01) |
| *H01L 33/50* | (2010.01) |
| *H01L 33/58* | (2010.01) |
| *H01L 33/62* | (2010.01) |
| *G09G 3/32* | (2016.01) |

(52) U.S. Cl.
CPC .......... *H01L 24/97* (2013.01); *H01L 25/0753* (2013.01); *H01L 27/1214* (2013.01); *H01L 33/0093* (2020.05); *H01L 33/06* (2013.01); *H01L 33/325* (2013.01); *H01L 33/38* (2013.01); *H01L 33/502* (2013.01); *H01L 33/58* (2013.01); *H01L 33/62* (2013.01); *H05B 33/12* (2013.01); *H05B 33/14* (2013.01); *G09G 3/32* (2013.01); *G09G 2300/04* (2013.01); *G09G 2300/0452* (2013.01); *G09G 2300/08* (2013.01); *H01L 33/504* (2013.01); *H01L 2221/68322* (2013.01); *H01L 2221/68327* (2013.01); *H01L 2221/68336* (2013.01); *H01L 2221/68354* (2013.01); *H01L 2221/68368* (2013.01); *H01L 2224/45099* (2013.01); *H01L 2224/4911* (2013.01); *H01L 2924/00* (2013.01); *H01L 2924/00014* (2013.01); *H01L 2924/12041* (2013.01); *H01L 2933/0066* (2013.01)

(58) Field of Classification Search
CPC . H01L 27/1214; H01L 33/0079; H01L 33/06; H01L 33/325; H01L 33/38; H01L 33/502; H01L 33/58; H01L 33/62; H01L 33/504; H01L 2221/68322; H01L 2221/68327; H01L 2221/68336; H01L 2221/68354; H01L 2221/68368; H01L 2924/00; H01L 2924/00014; H01L 2924/12041; H01L 2933/0066; H01L 2224/4911; H01L 2224/45099; H05B 33/14; H05B 33/12; G09G 2300/0452; G09G 2300/08; G09G 3/32; G09G 2300/04
See application file for complete search history.

(56) References Cited

U.S. PATENT DOCUMENTS

| | | |
|---|---|---|
| 2007/0195044 A1 | 8/2007 | Uemoto |
| 2009/0315061 A1 | 12/2009 | Andrews |
| 2011/0006316 A1* | 1/2011 | Ing .................... G02F 1/133611 257/89 |
| 2013/0043498 A1 | 2/2013 | Pyo et al. |
| 2013/0240934 A1* | 9/2013 | Park ....................... H01L 33/60 257/98 |
| 2014/0111775 A1 | 4/2014 | Nishikawa et al. |
| 2014/0246699 A1 | 9/2014 | Kim et al. |
| 2014/0319568 A1 | 10/2014 | Kaide et al. |
| 2015/0076528 A1 | 3/2015 | Chan et al. |
| 2015/0097200 A1 | 4/2015 | Bergmann et al. |
| 2015/0249069 A1 | 9/2015 | Yoshida et al. |
| 2016/0198567 A1 | 7/2016 | Hong et al. |
| 2016/0247980 A1 | 8/2016 | Kaide et al. |

FOREIGN PATENT DOCUMENTS

| | | |
|---|---|---|
| JP | 2003-93961 | 4/2003 |
| JP | 2007-226246 | 9/2007 |
| JP | 2013-025194 | 2/2013 |
| JP | 56-17384 | 11/2014 |
| JP | 2014-224230 | 12/2014 |
| JP | 2015-500562 | 1/2015 |
| KR | 10-2007-0087291 | 8/2007 |
| KR | 10-2012-0075144 | 7/2012 |
| KR | 10-1198374 | 11/2012 |
| KR | 10-1243819 | 3/2013 |
| KR | 10-2013-0092896 | 8/2013 |
| KR | 10-2013-0137985 | 12/2013 |
| KR | 10-1362516 | 2/2014 |
| KR | 10-1436123 | 11/2014 |
| KR | 10-1476207 | 12/2014 |
| WO | 2014/050876 | 4/2014 |

OTHER PUBLICATIONS

Liu et al., "On-demand multi-batch self-assembly of hybrid MEMS by patterning solders of different melting points", J. Mircromech. Microeng. 17 (2007) 2163-2168.

Non-Final Office Action dated Feb. 9, 2017, in U.S. Appl. No. 15/218,514.

Notice of Allowance dated Sep. 19, 2017, in U.S. Appl. No. 15/218,514.

Notice of Allowance dated Nov. 26, 2018, in U.S. Appl. No. 15/851,718.

Partial Supplemental EP Search Report dated Jan. 25, 2019 in corresponding Application No. 16828068.3.

Chinese Office Action dated Feb. 22, 2019, in corresponding US Application No. 2015/076528.

European Office Action dated Apr. 24, 2020, issued in European Patent Application No. 16828068.3.

* cited by examiner

DISPLAY APPARATUS AND MANUFACTURING METHOD THEREOF

CROSS-REFERENCE TO RELATED APPLICATIONS

This application is a Continuation of U.S. patent application Ser. No. 15/851,718, filed Dec. 21, 2017, which is a Continuation of U.S. patent application Ser. No. 15/218,514, filed Jul. 25, 2016, which claims priority to and the benefit of U.S. provisional patent application No. 62/196,282, filed on Jul. 23, 2015, and 62/267,770, filed on Dec. 15, 2015, each of which is incorporated by reference for all purposes as if fully set forth herein.

BACKGROUND

Field

Exemplary embodiments of the present disclosure relate to a display apparatus and a method of manufacturing the same, and more particularly, to a display apparatus using micro-light emitting diodes and a method of manufacturing the same.

Discussion of the Background

A light emitting diode refers to an inorganic semiconductor device configured to emit light through recombination of electrons and holes, and has been used in various fields including displays, automobile lamps, general lighting, and the like. Since the light emitting diode has various advantages such as long lifespan, low power consumption, and rapid response, it is expected that a light emitting device using the light emitting diode will replace existing light sources.

Recently, smart TVs or monitors have realized colors using a thin film transistor liquid crystal display (TFT LCD) panel and tend to use light emitting diodes (LEDs) as a light source for a backlight unit for color realization. In addition, a display apparatus is often manufactured using organic light emitting diodes (OLEDs). However, for a TFT-LCD, since one LED is used as a light source for many pixels, a light source of a backlight unit is always turned on. Accordingly, the TFT-LCD suffers from constant power consumption regardless of brightness on a displayed screen. In order to compensate for this problem, some display apparatuses are configured to divide a screen into several regions so as to allow control of brightness in these regions. However, since several to dozens of thousands of pixels are used as a unit for division of the screen, it is difficult to achieve accurate regulation of brightness while reducing power consumption. On the other hand, although an OLED has continuously reduced power consumption through development of technology, the OLED still has much higher power consumption than LEDs formed of inorganic semiconductors, and thus has low efficiency.

In addition, a passive matrix (PM) drive type OLED can suffer from deterioration in response speed upon pulse amplitude modulation (PAM) of the OLED having large capacitance, and can suffer from deterioration in lifespan upon high current driving through pulse width modulation (PWM) for realizing a low duty ratio. Moreover, an active matrix (AM) driving type OLED requires connection of TFTs for each pixel, thereby causing increase in manufacturing costs and non-uniform brightness according to characteristics of TFTs.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display apparatus using micro-light emitting diodes providing low power consumption to be applicable to a wearable apparatus, a smartphone, or a TV, and a method of manufacturing the same.

Exemplary embodiments provide a display apparatus providing low power consumption and enabling accurate regulation of brightness and a method of manufacturing the same.

Additional aspects will be set forth in the detailed description which follows, and, in part, will be apparent from the disclosure, or may be learned by practice of the inventive concept.

An exemplary embodiment discloses a display apparatus including: a first substrate including a light emitting diode part including a plurality of light emitting diodes regularly arranged on the first substrate; and a second substrate including a TFT panel unit including a plurality of TFTs driving the light emitting diodes, wherein the first substrate and the second substrate are coupled to each other so as to face each other such that the light emitting diodes are electrically connected to the TFTs, respectively.

The display apparatus may also include: a support substrate; a plurality of blue light emitting diodes arranged on an upper surface of the support substrate; a plurality of green light emitting diodes arranged on the upper surface of the support substrate to be placed adjacent the plurality of blue light emitting diodes; and a plurality of red light emitting diodes arranged on the upper surface of the support substrate to be placed adjacent either the plurality of blue light emitting diodes or the plurality of green light emitting diodes.

Each of the plurality of blue light emitting diodes, the plurality of green light emitting diodes and the plurality of red light emitting diodes may include an n-type semiconductor layer; a p-type semiconductor layer; an active layer interposed between the n-type semiconductor layer and the p-type semiconductor layer; an n-type electrode coupled to the n-type semiconductor layer; a p-type electrode coupled to the p-type semiconductor layer; and a wall surrounding the p-type electrode.

The display apparatus may further include a first bonding portion bonding the plurality of blue light emitting diodes to the support substrate; a second bonding portion bonding the plurality of green light emitting diodes to the support substrate; and a third bonding portion bonding the plurality of red light emitting diodes to the support substrate, and the first to third bonding portions may have different melting points.

The display apparatus may further include an anisotropic conductive film electrically connecting the light emitting diode part to the TFT panel unit.

The plurality of light emitting diodes may include blue light emitting diodes emitting blue light, and the display apparatus may further include a wavelength conversion part including at least one of a blue light portion emitting the blue light, a green light portion emitting green light through conversion of the blue light into the green light, and a red light portion emitting red light through conversion of the blue light into the red light.

The plurality of light emitting diodes may include blue light emitting diodes emitting blue light and red light emitting diodes emitting red light, and the display apparatus may further include a wavelength conversion part including at least one of a blue light portion emitting the blue light, a green light portion emitting green light through conversion of the blue light into the green light, and a red light portion emitting the red light.

The wavelength conversion part may be formed on a third substrate and the first substrate may be coupled to the third substrate to allow wavelength conversion of light emitted from the plurality of light emitting diodes. The green light portion and the red light portion may include phosphors. Specifically, the green light portion may include nitride phosphors and the red light portion may include nitride or fluoride phosphors (KSF).

At least one of the first to third substrates may be a transparent substrate or an opaque flexible substrate.

The plurality of light emitting diodes may include blue light emitting diodes emitting blue light, and the display apparatus may further include a white phosphor portion converting blue light emitted from the blue light emitting diodes into white light; and a color filter including a blue light portion allowing blue light of the white light emitted through the white phosphor portion to pass therethrough, a green light portion allowing green light of the white light emitted through the white phosphor portion to pass therethrough, and a red light portion allowing red light of the white light emitted through the white phosphor portion to pass therethrough.

Each of the light emitting diodes may include an n-type semiconductor layer, a p-type semiconductor layer, and an active layer interposed between the n-type semiconductor layer and the p-type semiconductor layer, and a wall may be formed on the p-type semiconductor layer.

An exemplary embodiment further discloses a display apparatus including: a backlight unit including a light emitting diode part and a TFT panel unit driving the light emitting diode part, the light emitting diode part including a plurality of light emitting diodes regularly arranged therein; and a TFT-LCD panel including a plurality of pixels selectively allowing light emitted from the backlight unit to pass therethrough so as to emit any one of blue light, green light and red light, wherein each of the light emitting diodes may be disposed to supply light to 1 to 1,000 pixels of the TFT-LCD panel.

The display apparatus may further include a first driver generating a first control signal controlling the backlight unit; and a second driver generating a second control signal controlling the TFT-LCD, and the first control signal may be interlinked with the second control signal.

The TFT-LCD panel may include a plurality of pixels and the plurality of light emitting diodes may be arranged corresponding to the plurality of pixels in the backlight unit, respectively.

The TFT-LCD panel may include a plurality of pixels and the plurality of light emitting diodes may be arranged to supply light to two to several hundred pixels among the plurality of pixels in the backlight unit.

The plurality of light emitting diodes may include blue light emitting diodes, and the display apparatus may further include a white phosphor or a white phosphor film converting blue light emitted from the blue light emitting diodes into white light.

A ratio (S/A) of luminous area S of the light emitting diodes to area A irradiated with light emitted from the light emitting diodes may be 1/1000 or less.

Each of the light emitting diodes may include an n-type semiconductor layer, a p-type semiconductor layer, and an active layer interposed between the n-type semiconductor layer and the p-type semiconductor layer, and a wall may be formed on the p-type semiconductor layer.

An exemplary embodiment further discloses a method of manufacturing a display apparatus including: forming a light emitting diode part such that a plurality of light emitting diodes is regularly arranged therein; and coupling the light emitting diode part to a TFT panel unit, wherein forming the light emitting diode part may include forming the plurality of light emitting diodes on a substrate to be regularly arranged thereon; transferring the plurality of light emitting diodes to a stretchable substrate; two-dimensionally enlarging the stretchable substrate such that a separation distance between the light emitting diodes is enlarged; and coupling at least one of the light emitting diodes to a support substrate, with the separation distance between the light emitting diodes enlarged by the stretchable substrate.

The separation distance between the light emitting diodes enlarged by the stretchable substrate may be twice a width of the light emitting diodes.

Coupling the light emitting diode part to the TFT panel unit may be performed using an anisotropic conductive film.

According to exemplary embodiments, the display apparatus may employ micro-light emitting diodes formed of nitride semiconductors and thus can provide high efficiency and high resolution to be applicable to a wearable apparatus while reducing power consumption.

Further, the display apparatus according to the exemplary embodiments may employ a stretchable substrate, thereby providing more convenience in manufacture of the display apparatus than manufacture of the display apparatus using micro-light emitting diodes.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the disclosed technology, and are incorporated in and constitute a part of this specification, illustrate exemplary embodiments of the disclosed technology, and together with the description serve to describe the principles of the disclosed technology.

DETAILED DESCRIPTION OF THE ILLUSTRATED EMBODIMENTS

Figure 1:
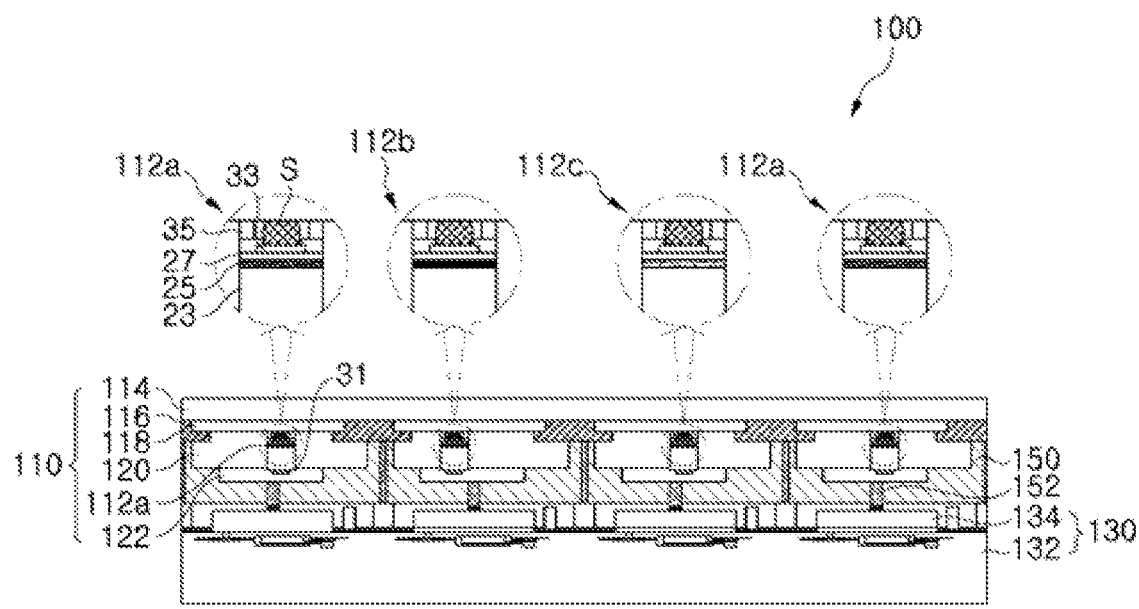
FIG. 1 is a sectional view of a display apparatus according to a first exemplary embodiment of the present disclosure.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. Regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments of the present disclosure will be described in detail with reference to the accompanying drawings.

Figure 2:
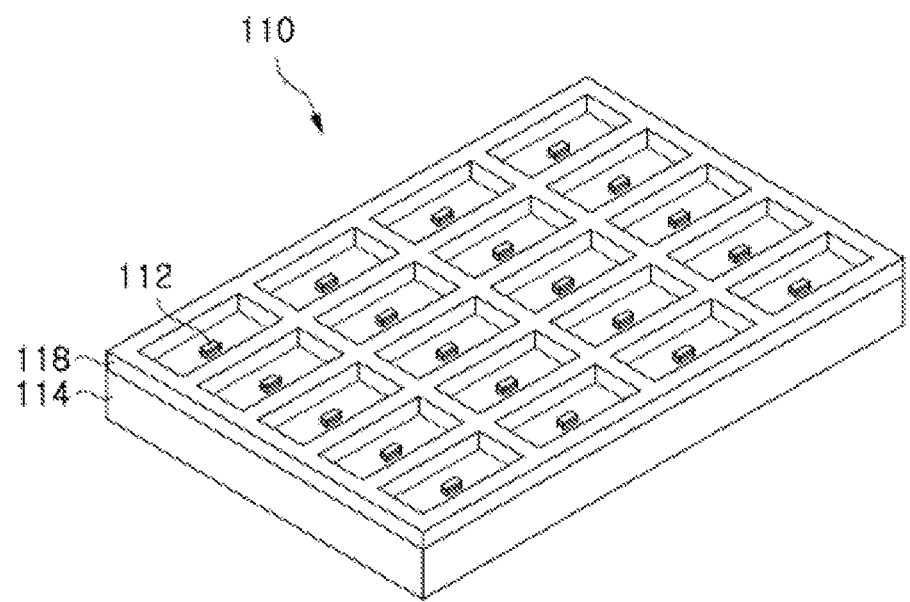
FIG. 2 is a perspective view of a light emitting part of the display apparatus according to the first exemplary embodiment of the present disclosure.

FIG. 1 is a sectional view of a display apparatus according to a first exemplary embodiment of the present disclosure, and FIG. 2 is a perspective view of a light emitting part of the display apparatus according to the first exemplary embodiment of the present disclosure.

Referring to FIG. 1, a display apparatus 100 according to the first exemplary embodiment includes a light emitting diode part 110, a TFT panel unit 130, and an anisotropic conductive film 150.

Referring to FIG. 1 and FIG. 2, the light emitting diode part 110 includes light emitting diodes 112, a support substrate 114, transparent electrodes 116, a blocking part 118, an insulation layer 120, and first connection electrodes 122.

The light emitting diode part 110 includes a plurality of light emitting diodes 112, and the plurality of light emitting diodes 112 is regularly arranged on the support substrate 114. For example, the plurality of light emitting diodes 112 may be arranged in a matrix form thereon, as shown in FIG. 2. In this exemplary embodiment, the plurality of light emitting diodes 112 includes a plurality of blue light emitting diodes 112a emitting blue light, a plurality of green light emitting diodes 112b emitting green light, and a plurality of red light emitting diodes 112c emitting red light. The plural blue light emitting diodes 112a, the plural green light emitting diodes 112b and the plural red light emitting diodes 112c are alternately arranged such that the blue light emitting diode 112a, the green light emitting diode 112b and the red light emitting diode 112c are adjacent to one another.

In this exemplary embodiment, as shown in FIG. 2, the light emitting diode part 110 allows the display apparatus 100 to be driven by power applied from an exterior power source. That is, an image can be reproduced through on-off combination of the light emitting diodes 112 in the light emitting diode part 110 without using a separate LCD. Accordingly, a region including a single light emitting diode 112 may be used as a sub-pixel in the display apparatus 100. As shown in FIG. 2, in the light emitting diode part 110, one sub-pixel may have a larger size than the light emitting diode 112 disposed inside the sub-pixel.

Referring to FIG. 1 again, each of the light emitting diodes 112 may include an n-type semiconductor layer 23, an active layer 25, a p-type semiconductor layer 27, an n-type electrode 31, a p-type electrode 33, and a wall 35. The n-type semiconductor layer 23, the active layer 25 and the p-type semiconductor layer 27 may include Group III-V based compound semiconductors. By way of example, the n-type semiconductor layer 23, the active layer 25 and the p-type semiconductor layer 27 may include nitride semiconductors such as (Al, Ga, In)N. In other exemplary embodiments, locations of the n-type semiconductor layer 23 and the p-type semiconductor layer 27 can be interchanged.

The n-type semiconductor layer 23 may include an n-type dopant (for example, Si) and the p-type semiconductor layer 27 may include a p-type dopant (for example, Mg). The active layer 25 is interposed between the n-type semiconductor layer 23 and the p-type semiconductor layer 27. The active layer 25 may have a multi-quantum well (MQW) structure and a composition of the active layer 25 may be determined so as to emit light having a desired peak wavelength.

In addition, the light emitting structure including the n-type semiconductor layer 23, the active layer 25 and the p-type semiconductor layer 27 may be formed similar to a vertical type light emitting diode 112. In this structure, the n-type electrode 31 may be formed on an outer surface of the n-type semiconductor layer 23 and the p-type electrode 33 may be formed on an outer surface of the p-type semiconductor layer 27.

Further, as shown in FIG. 1, in order to couple each of the light emitting diodes 112 similar to the vertical type light emitting diode to the transparent electrode 116 of the support substrate 114, a bonding portion S may be formed between the p-type electrode 33 and the transparent electrode 116, and the wall 35 may be formed to prevent the bonding portion S from escaping from a space between the p-type electrode 33 and the transparent electrode 116.

The wall 35 may be formed to cover a portion of the p-type electrode 33 such that the p-type electrode 33 can be exposed on the p-type semiconductor layer 27, and may be composed of a plurality of layers, as shown in the drawings. The wall 35 may include a first layer and a second layer, and may be formed by forming the first layer including SiN on the p-type semiconductor layer 27 so as to cover a portion of the p-type electrode 33, followed by forming the second layer including $SiO_2$ on the first layer. The second layer may have a greater thickness and a smaller width than the first layer.

The support substrate 114 is a substrate on which the plurality of light emitting diodes 112 will be mounted, and may be an insulation substrate, a conductive substrate, or a circuit board. By way of example, the support substrate 114 may be a sapphire substrate, a gallium nitride substrate, a glass substrate, a silicon carbide substrate, a silicon substrate, a metal substrate, or a ceramic substrate. The support substrate 114 is formed on an upper surface thereof with the plurality of conductive patterns to be electrically connected to the plurality of light emitting diodes 112 and may include a circuit pattern therein, as needed. The support substrate 114 may be a flexible substrate.

The transparent electrode 116 may be formed on the support substrate 114 and may be electrically connected to the p-type electrode 33 of the light emitting diode 112. In this exemplary embodiment, a plurality of transparent electrodes 116 may be formed on the support substrate 114, and one light emitting diode 112 may be coupled to one transparent electrode 116, or the plurality of light emitting diodes 112 may be coupled to one transparent electrode 116, as needed. In addition, the plural transparent electrodes 116 may be separated from each other on the support substrate 114. By way of example, the transparent electrodes 116 may be formed of indium tin oxide (ITO) and the like.

The blocking part 118 is formed on the support substrate 114 and is provided in plural. The blocking part 118 allows light emitted from the light emitting diodes 112 to be emitted to the outside only through the transparent electrodes 116 and prevents light emitted from a certain light emitting diode from mixing with light emitted from adjacent light emitting diodes 112. Accordingly, the blocking part 118 may be formed between the transparent electrodes 116 separated from each other and may be formed to cover a portion of each of the transparent electrodes 116, as needed. In this exemplary embodiment, the blocking part 118 is formed of chromium (Cr).

The insulation layer 120 surrounds each of the light emitting diodes 112 and covers an exposed surface of a connecting plane between the light emitting diodes 112. With this structure, the insulation layer 120 may be formed to partially cover the blocking part 118. In the structure wherein the insulation layer 120 surrounds each of the light emitting diodes 112, the n-type semiconductor layer 23 and the n-type electrode 31 of each of the light emitting diodes 112 can be exposed through the insulation layer 120.

The first connection electrodes 122 cover the insulation layer 120 and may also cover the n-type semiconductor layer 23 and the n-type electrode 31 not covered by the insulation layer 120. Accordingly, the first connection electrodes 122 may be electrically connected to the n-type semiconductor layer 23.

The TFT panel unit 130 includes a panel substrate 132 and second connection electrodes 134, and is coupled to the light emitting diode part 110 to supply power to the light emitting diode part 110. The TFT panel unit 130 controls power supplied to the light emitting diode part 110 to allow only some of the light emitting diodes 112 in the light emitting diode part 110 to emit light.

The panel substrate 132 has a TFT drive circuit therein. The TFT drive circuit may be a circuit for driving an active matrix (AM) or a circuit for driving a passive matrix (PM).

The second connection electrode 134 may be electrically connected to the TFT drive circuit of the panel substrate 132 and to the first connection electrode 122 of the light emitting diode part 110. In this structure, power supplied through the TFT drive circuit can be supplied to each of the light emitting diodes 112 through the first and second connection electrodes 122, 134. In this exemplary embodiment, the second connection electrode 134 may be covered by a separate protective layer, which may include $SiN_x$.

The anisotropic conductive film 150 serves to electrically connect the light emitting diode part 110 to the TFT panel unit 130. The anisotropic conductive film 150 includes an adhesive organic insulation material and contains conductive particles uniformly dispersed therein to achieve electrical connection. The anisotropic conductive film 150 exhibits conductivity in the thickness direction thereof and insulation properties in the plane direction thereof. In addition, the anisotropic conductive film exhibits adhesive properties and can be used to bond the light emitting diode part 110 to the TFT panel such that the light emitting diode part 110 can be electrically connected to the TFT panel therethrough. Particularly, the anisotropic conductive film 150 can be advantageously used to connect ITO electrodes which are difficult to solder at high temperature.

As such, in the structure wherein the light emitting diode part 110 is coupled to the TFT panel via the anisotropic conductive film 150, the first connection electrode 122 of the light emitting diode part 110 is electrically connected to the second connection electrode 134 of the TFT panel unit 130, thereby forming an electrode connection portion 152.

FIGS. 3A-3P and FIGS. 4A-4G are sectional views and plan views illustrating a process of forming the light emitting diode part 110 of the display apparatus 100 according to the first exemplary embodiment of the present disclosure.

Figure 3A:
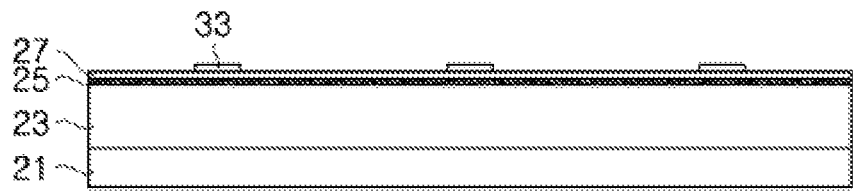
FIGS. 3A, 3B, 3C, 3D, 3E, 3F, 3G, 3H, 3I, 3J, 3K, 3L, 3M, 3N, 3O, and 3P and FIGS. 4A, 4B, 4C, 4D, 4E, 4F, and 4G are sectional views and plan views illustrating a process of forming the light emitting diode part of the display apparatus according to the first exemplary embodiment of the present disclosure.

The process of forming the light emitting diode part 110 according to this exemplary embodiment will be described with reference to FIGS. 3A-3P and FIGS. 4A-4G. First, as shown in FIG. 3A, an n-type semiconductor layer 23, an active layer 25 and a p-type semiconductor layer 27 are sequentially grown on a growth substrate. Then, a p-type electrode 33 is formed on the p-type semiconductor layer 27. In this exemplary embodiment, a plurality of p-type electrodes 33 may be formed to be separated from each other by a predetermined distance such that one p-type electrode 33 is provided to one light emitting diode 112.

Figure 3B:
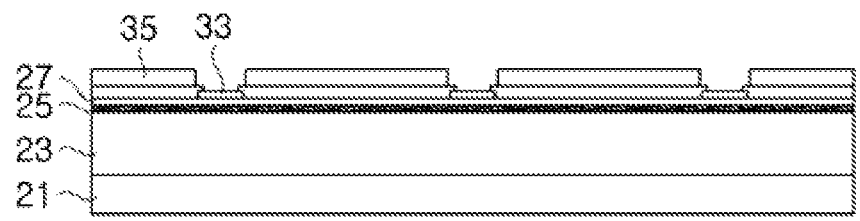

Referring to FIG. 3B, after forming the p-type electrodes 33, a wall 35 is formed on the p-type semiconductor layer 27. The wall 35 may be composed of first and second layers. The first layer includes SiN and is formed to cover the entirety of the p-type semiconductor layer 27 while covering a portion of each of the p-type electrodes 33. The second layer includes $SiO_2$ and is formed on the first layer. The second layer may have a greater thickness than the first layer and may be formed on a region of the first layer in which the p-type electrode 33 is not formed.

Figure 3C:
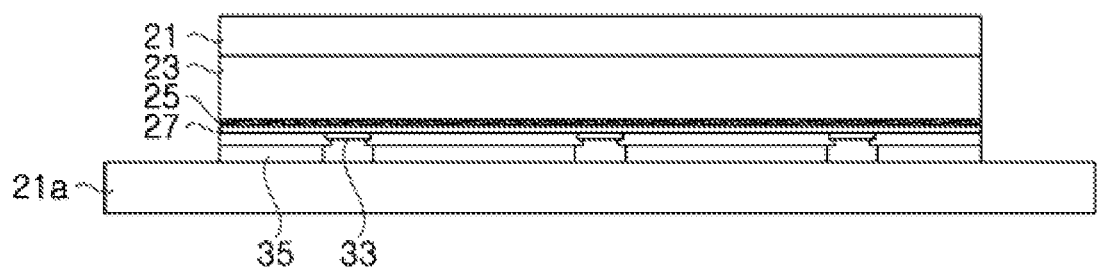

Referring to FIG. 3C, after the wall 35 is formed on the p-type semiconductor layer 27, the grown semiconductor layers are coupled to a first substrate. In this process, the second layer of the wall 35 is coupled to the first substrate. The first substrate may be the same as the support substrate 114 and may be a sapphire substrate in this exemplary embodiment.

Figure 3D:
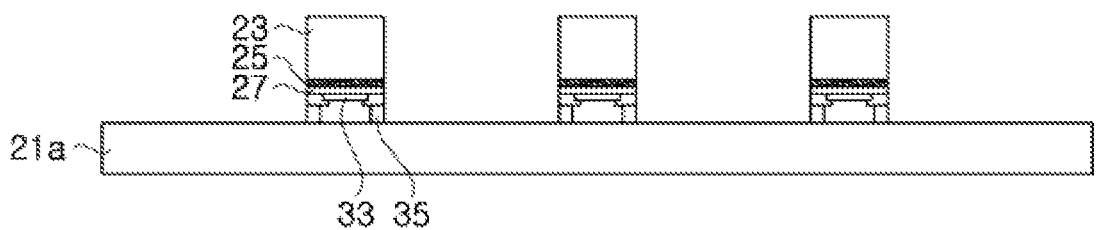

Referring to FIG. 3D, with the semiconductor layers coupled to the first substrate, the growth substrate may be removed from the semiconductor layers by LLO and the semiconductor layers may be divided into individual light emitting diodes 112 by etching. Here, division of the semiconductor layers into individual light emitting diodes 112 may be performed by dry etching.

Figure 3E:
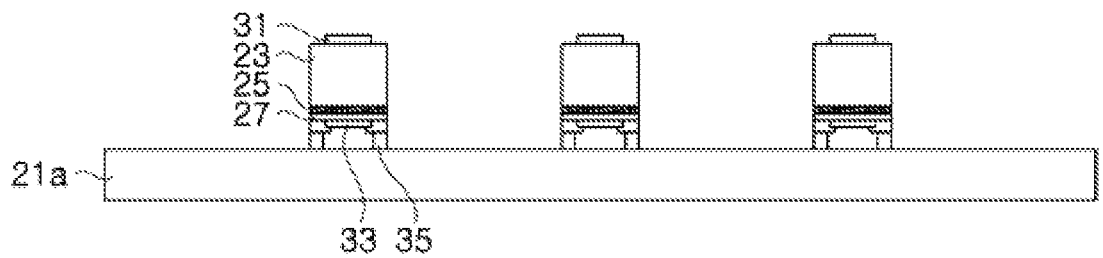
Figure 3F:
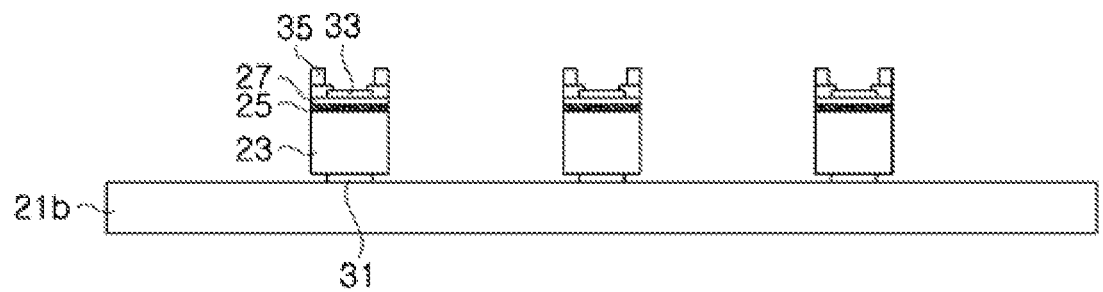

Referring to FIG. 3E, after the semiconductor layers are divided into the individual light emitting diodes 112, n-type electrodes 31 may be formed on the n-type semiconductor layer 23. Alternatively, the n-type electrodes 31 may be formed before division of the semiconductor layers into the individual light emitting diodes 112. Then, as shown in FIG. 3F, the light emitting diodes 112 are coupled to a second substrate such that the n-type electrodes 31 can be coupled to the second substrate, followed by removing the first substrate. The second substrate may be the same kind of substrate as the first substrate.

Figure 3G:
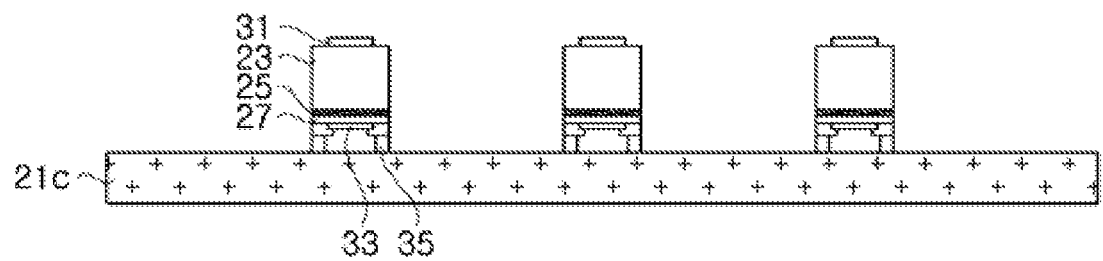
Figure 3H:
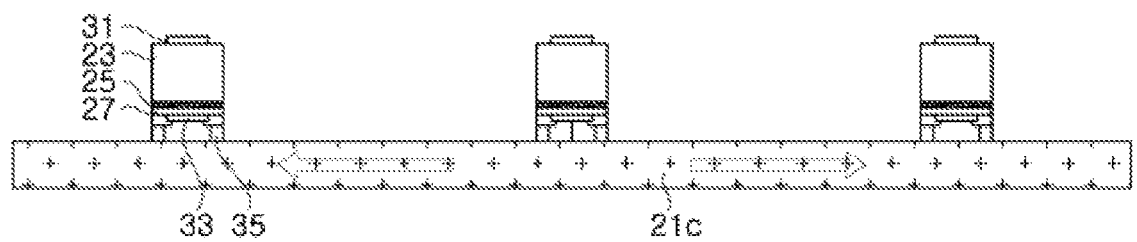

Then, as shown in FIG. 3G, the light emitting diodes 112 are coupled to a third substrate such that the wall 35 can be coupled to the third substrate, followed by removing the second substrate. In this exemplary embodiment, the third substrate may be a stretchable substrate that is stretchable in the plane direction thereof. Thus, as shown in FIG. 3H, the stretchable third substrate is stretched to enlarge distances between the light emitting diodes 112.

Figure 3I:
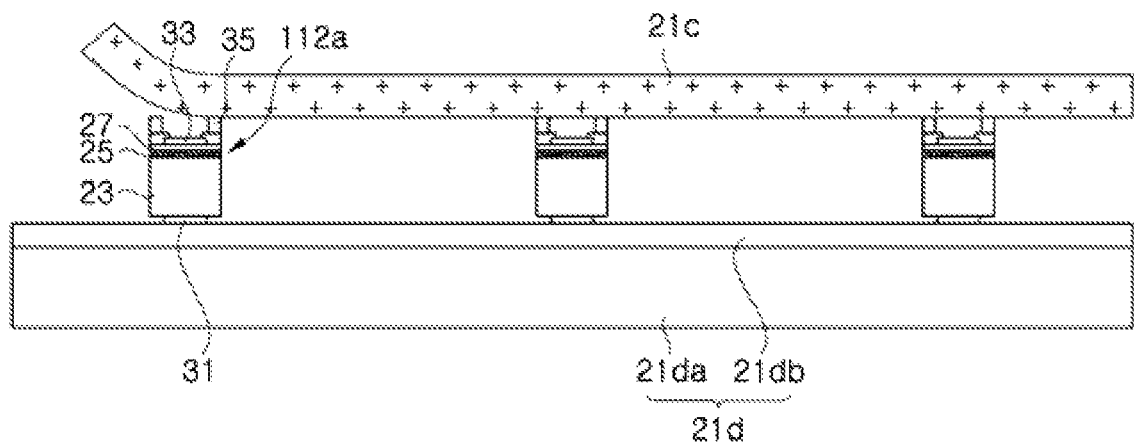

With the distances between the light emitting diodes 112 enlarged, the light emitting diodes 112 are coupled to a fourth substrate such that the n-type electrodes 31 can be coupled to the fourth substrate, as shown in FIG. 3I. As a result, the distances between the light emitting diodes 112 can be maintained by the stretchable third substrate. In this exemplary embodiment, the fourth substrate may include a flexible base and a bonding layer formed on the base.

Figure 3J:
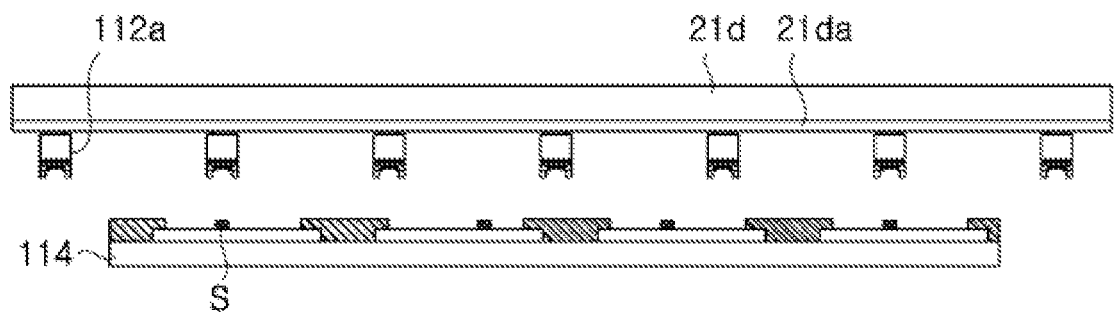

Then, referring to FIG. 3J, the plurality of light emitting diodes 112 arranged on the fourth substrate is bonded to the support substrate 114, which may be formed with a bonding portion S at a location corresponding to each of the light emitting diodes 112. With the transparent electrodes 116 and the blocking part 118 formed on the support substrate 114, the bonding portion S is formed at a mounting location of each of the light emitting diodes 112 on the support substrate 114. Accordingly, even when the entire plural light emitting diodes coupled to the fourth substrate are transferred to an upper surface of the support substrate 114, the light emitting diodes 112 can be transferred only to locations of the support substrate 114 at which the bonding portions S are formed.

Figure 3K:
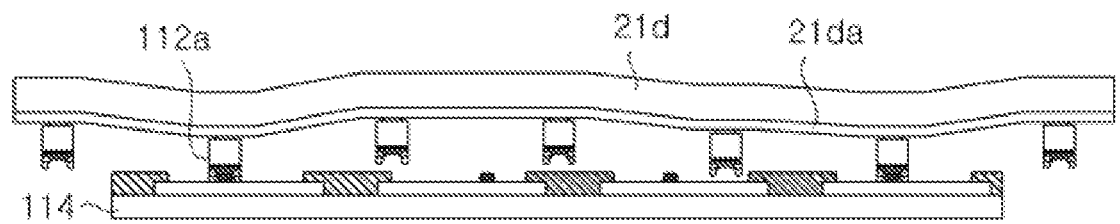

Referring to FIG. 3K, external force may be applied only to the light emitting diodes 112 disposed corresponding to the locations of the bonding portions S on the support substrate 114 among the light emitting diodes 112 coupled to the fourth substrate, such that only the light emitting diodes 112 disposed corresponding to the bonding portions S can be bonded to the support substrate 114. As a result, as shown in FIG. 3L, the light emitting diodes 112 can be coupled to the support substrate at the locations of the bonding portions S thereon.

Although not shown in the drawings, in the case where only some light emitting diodes 112 are selectively coupled to the support substrate 114 by applying external force only to target light emitting diodes among the plurality of light emitting diodes 112 arranged on the fourth substrate as shown in FIG. 3K, the stretchable third substrate may be omitted. That is, only some light emitting diodes 112 may be coupled to the support substrate 114 by selectively applying external force only to target light emitting diodes to be coupled to the support substrate 114 using a flexible fourth substrate instead of the second substrate shown in FIG. 3F.

Figure 3L:
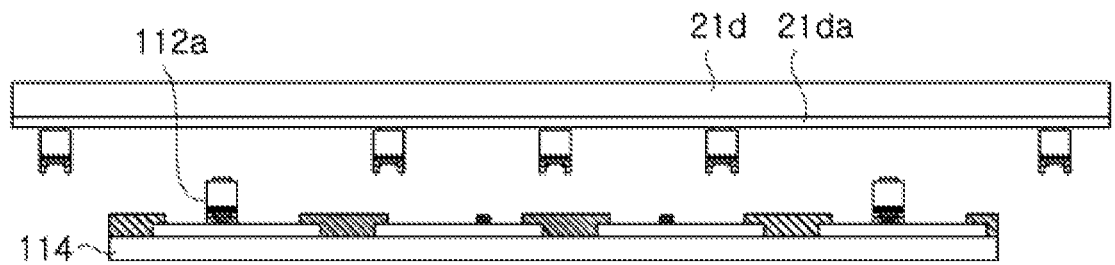

In this exemplary embodiment, with regard to mounting the light emitting diodes 112 on the support substrate 114 as shown in FIG. 3L, the following description will be given of mounting blue light emitting diodes 112a, green light emitting diodes 112b and red light emitting diodes 112c on the support substrate 114 with reference to FIGS. 4A-4G. Here, the processes of manufacturing each of the blue light emitting diodes 112a, the green light emitting diodes 112b and the red light emitting diodes 112c are the same those shown in FIG. 3A to FIG. 3I.

Figure 4A:
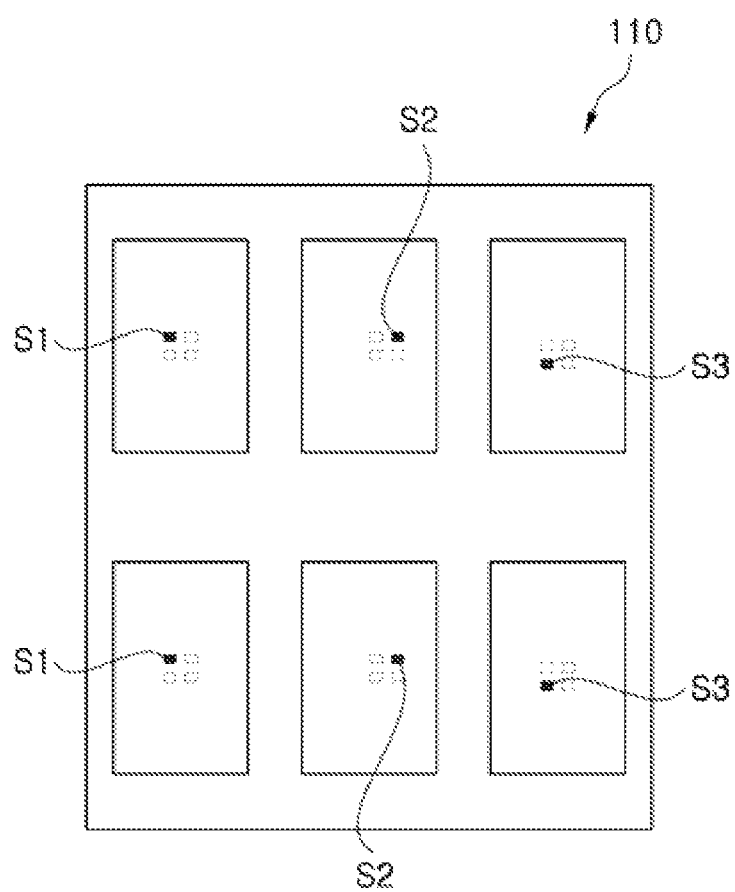

Like FIG. 3J, FIG. 4A shows the bonding portions S formed on the support substrate 114, in which the bonding portions S are formed at all locations on the support substrate 114 at which the blue light emitting diodes 112a, the green light emitting diodes 112b and the red light emitting diodes 112c are coupled, respectively. The bonding portions S may be classified into first to third bonding portions S1, S2, S3. The first bonding portion S1 is formed to bond the blue light emitting diodes 112a to the support substrate and the second bonding portion S2 is formed to bond the green light emitting diodes 112b thereto. The third bonding portion S3 is formed to bond the red light emitting diodes 112c thereto.

The first to third bonding portions S1, S2, S3 may have different bonding temperatures. Specifically, the first bonding portion S1 has the highest bonding temperature and the third bonding portion S3 has the lowest bonding temperature. For example, the first bonding portion S1 is formed of AgSn and has a bonding temperature of about 230° C. and the second bonding portion S2 is formed of ZnSn and has a bonding temperature of about 198° C. The third bonding portion S3 is formed of In and has a bonding temperature of about 157° C. The bonding temperatures of the first to third bonding portions S1, S2, S3 are differently set due to different bonding sequences of the light emitting diodes 112 to the respective bonding portions S.

Since the blue light emitting diodes 112a are first bonded to the support substrate 114, the first bonding portion Si has the highest bonding temperature. Thus, since the first bonding portion S1 has a higher bonding temperature than the second bonding portion S2 or the third bonding portion S3, the first bonding portion Si can maintain a bonded state of the blue light emitting diodes 112a during bonding of the green light emitting diodes 112b or the red light emitting diodes 112c.

Figure 4B:
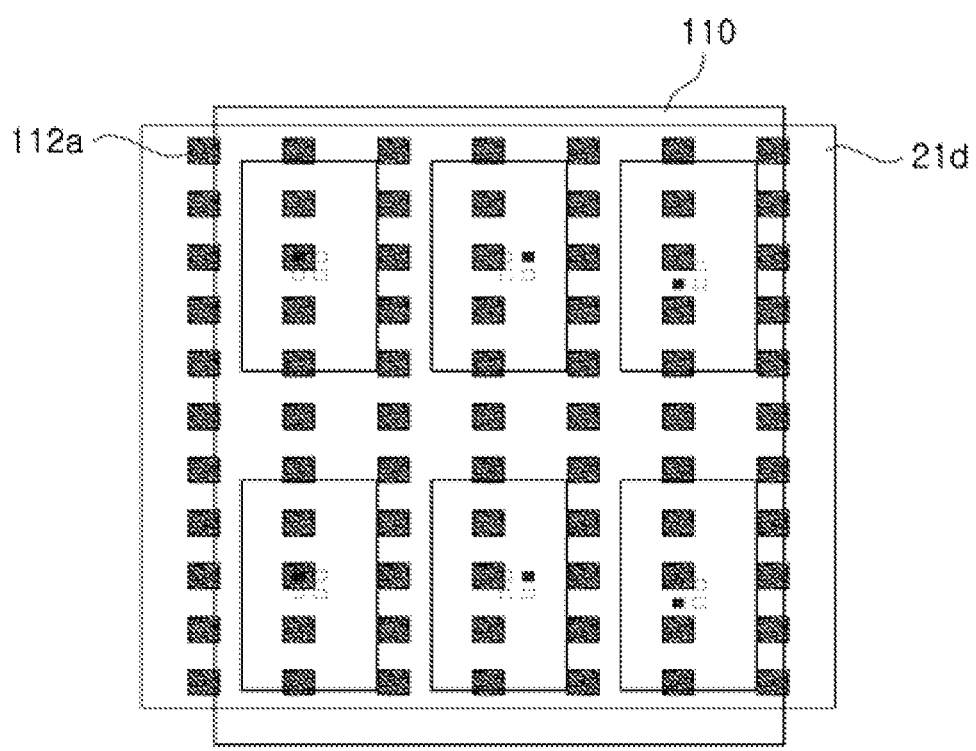

After the first to third bonding portions S1, S2, S3 are formed on the support substrate 114 as shown in FIG. 4A, the fourth substrate on which the blue light emitting diodes 112a are formed is placed at a corresponding location on the support substrate 114, and the blue light emitting diodes 112a are coupled to the support substrate 114, as shown in FIG. 4B. Here, the distances between the blue light emitting diodes 112a formed on the fourth substrate are widened by the stretchable substrate, which is provided as the third substrate, as compared with the distances between the blue light emitting diodes 112a formed on the growth substrate. Accordingly, each of the blue light emitting diodes 112a is not disposed at a location corresponding to the second bonding portion S2 or the third bonding portion S3. Then, with the blue light emitting diodes 112a contacting the first bonding portion S1, the first bonding portion S1 is heated to about 230° C. and cooled to bond the blue light emitting diodes 112a to the support substrate 114 via the first bonding portion S1.

Figure 4C:
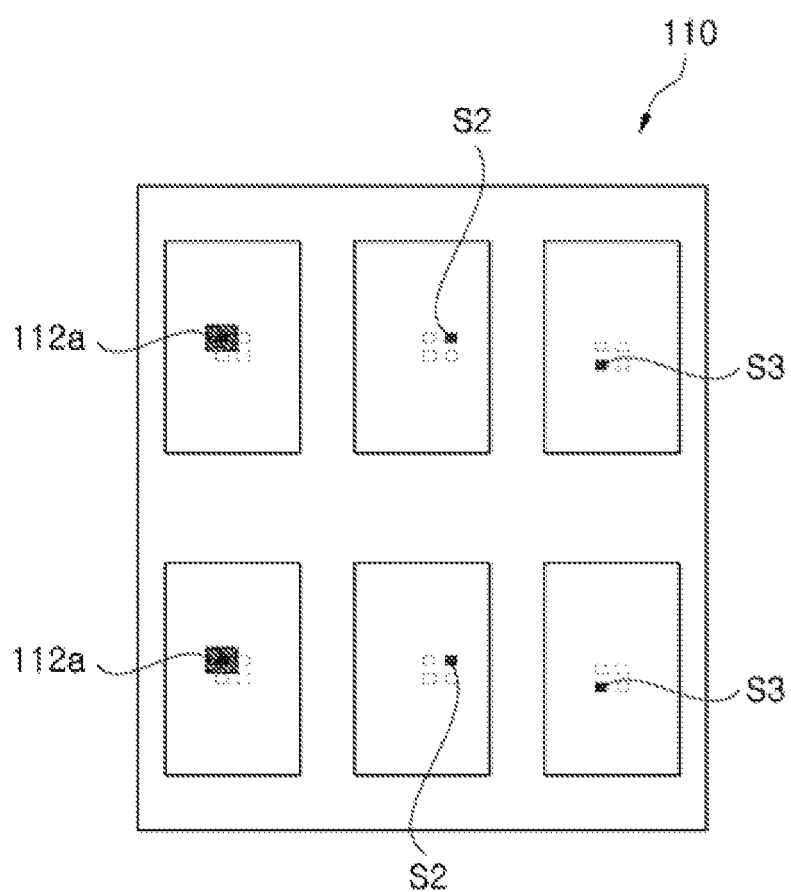
Figure 4D:
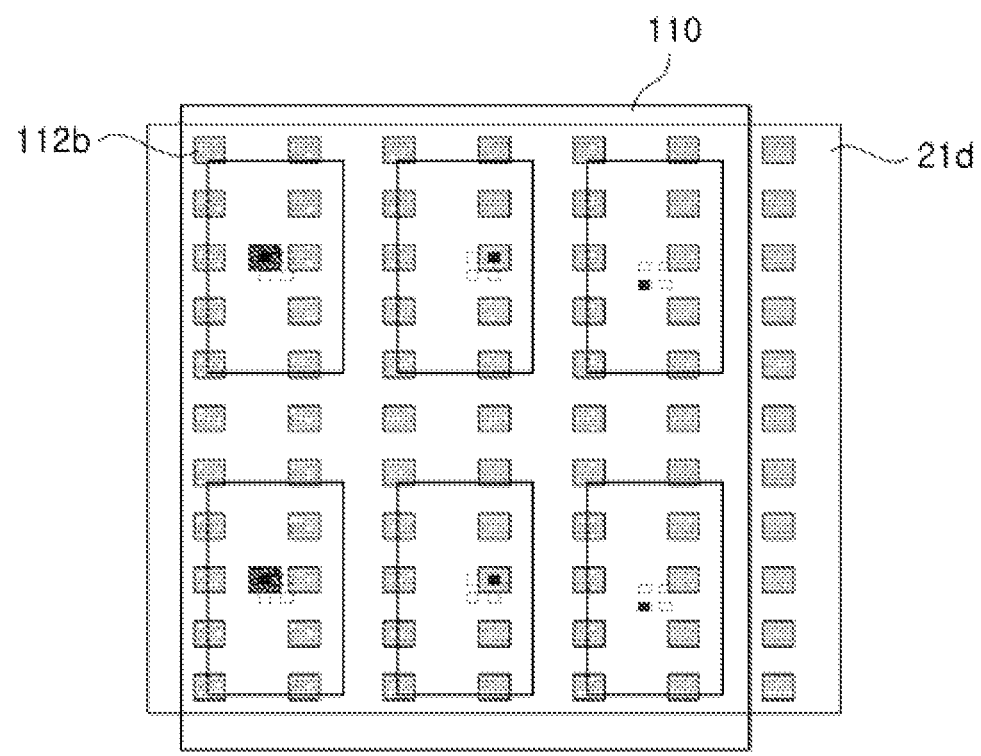

FIG. 4C shows the blue light emitting diodes 112a bonded to the support substrate 114. Thereafter, the fourth substrate on which the green light emitting diodes 112b are formed is placed at a corresponding location on the support substrate 114, and the green light emitting diodes 112b are bonded to the support substrate 114, as shown in FIG. 4D. Here, the distances between the green light emitting diodes 112b formed on the fourth substrate are greater than the distances between the green light emitting diodes 112b formed on the growth substrate, as described above. Accordingly, there is no interference between the blue light emitting diode 112a and the green light emitting diode 112b placed at locations corresponding to the second bonding portion S2 formed on the support substrate 114. Then, with the green light emitting diodes 112b contacting the second bonding portion S2, the second bonding portion S2 is heated to about 198° C. and cooled to bond the green light emitting diodes 112b to the support substrate 114 via the second bonding portion S2. In this way, the green light emitting diodes 112b can be bonded to the support substrate 114.

Figure 4E:
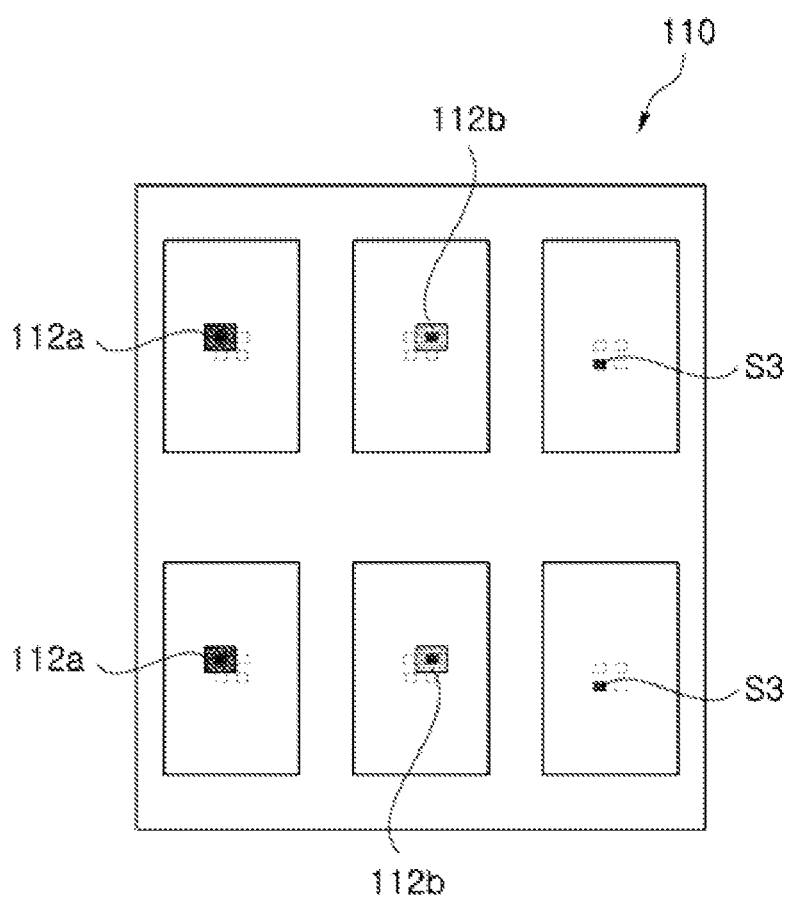
Figure 4F:
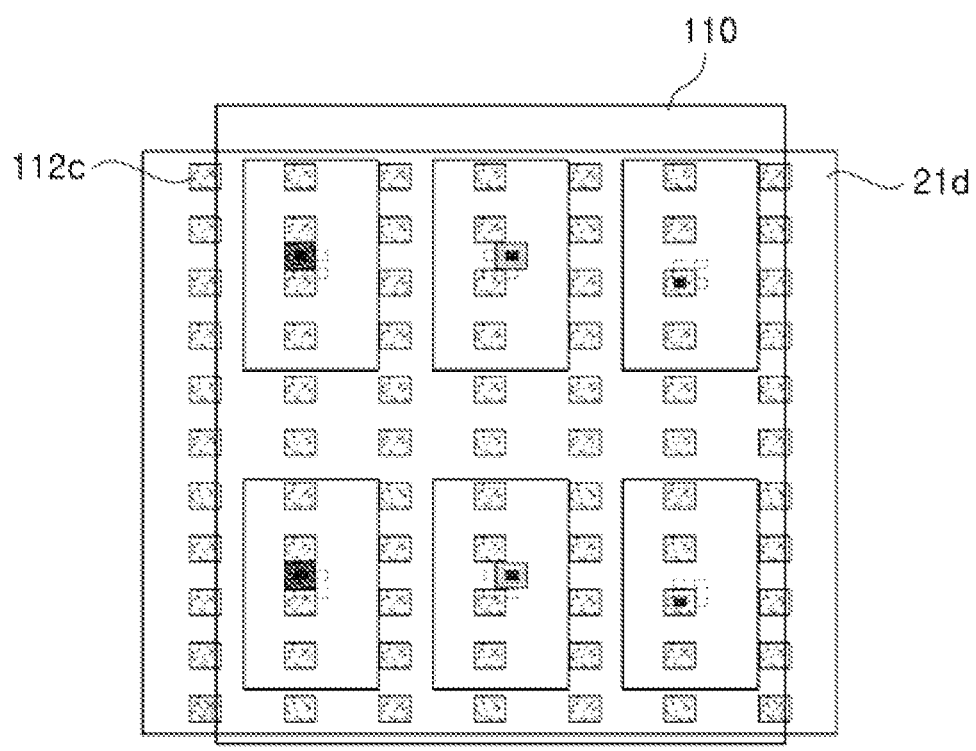
Figure 4G:
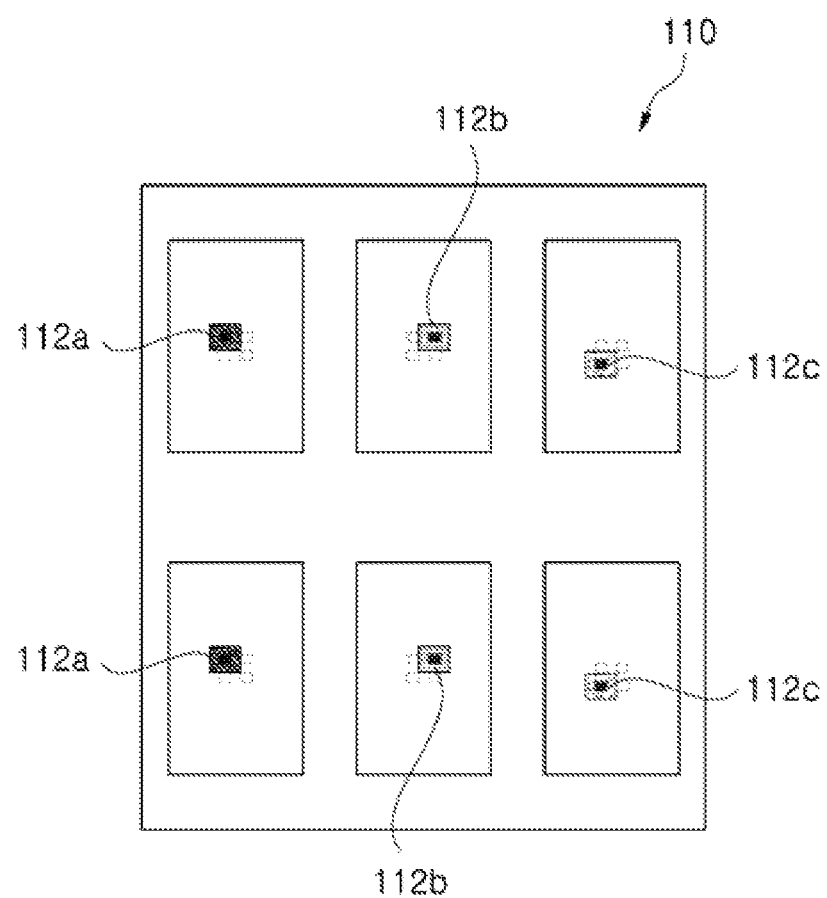

FIG. 4E shows the blue light emitting diodes 112a and the green light emitting diodes 112b bonded to the support substrate 114. Thereafter, the fourth substrate on which the red light emitting diodes 112c are formed is placed at a corresponding location on the support substrate 114, and the red light emitting diodes 112c are bonded to the support substrate 114, as shown in FIG. 4F. Here, the distances between the red light emitting diodes 112c formed on the fourth substrate are greater than the distances between the red light emitting diodes 112c formed on the growth substrate, as described above, thereby preventing interference with the blue light emitting diodes 112a or the green light emitting diodes 112b disposed on the support substrate 114. Then, with the red light emitting diodes 112c contacting the third bonding portion S3, the third bonding portion S3 are heated to about 157° C. and cooled to bond the red light emitting diodes 112c to the support substrate 114 via the third bonding portion S3. In this way, the green light emitting diodes 112b can be bonded to the support substrate 114. FIG. 4G shows the blue light emitting diode 112a, the green light emitting diode 112b and the red light emitting diode 112c bonded to the support substrate 114.

In this exemplary embodiment, separation distances between the blue light emitting diode 112a, the green light emitting diode 112b and the red light emitting diode 112c formed on the different fourth substrates may be at least twice the width of each of the light emitting diodes 112. In this way, with the distances between the light emitting diodes maintained at at least twice the width of each of the light emitting diodes on the support substrate 114, the light emitting diodes 112 are bonded to the support substrate 114, thereby preventing interference between the other light emitting diodes 112.

Figure 3M:
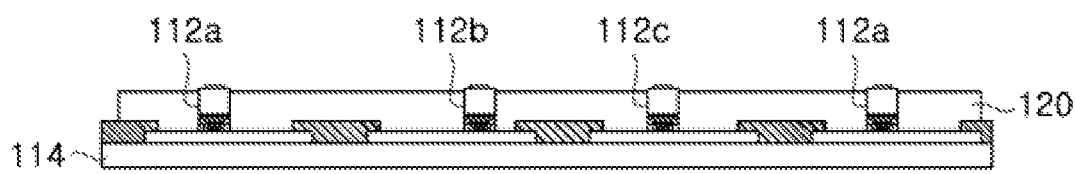
Figure 3N:
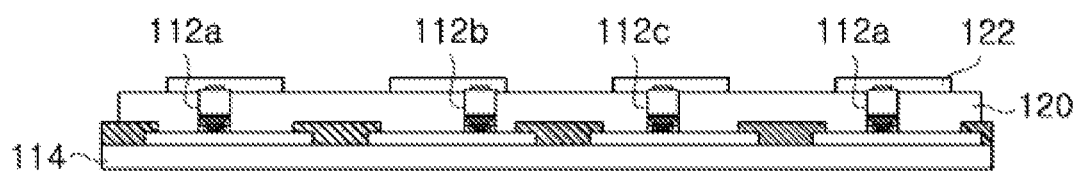

FIG. 3M is a sectional view corresponding to the plan view shown in FIG. 4G. That is, referring to FIG. 3M, each of the blue light emitting diodes 112a, the green light emitting diodes 112b and the red light emitting diodes 112c is bonded to the support substrate 114. In this state, an insulation layer 120 may be formed to cover the entirety of each of the light emitting diodes 112 excluding a portion thereof, as shown in FIG. 3N. The insulation layer 120 is formed to cover both the transparent electrodes 116 and the blocking part 118 while surrounding each of the light emitting diodes 112. With this structure, the insulation layer 120 can prevent the transparent electrode 116 electrically connected to each of the light emitting diodes 112 from being exposed to the outside. An upper surface of the n-type semiconductor layer 23 and the n-type electrode 31 of each of the light emitting diodes 112 can be exposed through an upper surface of the insulation layer 120.

Figure 3O:
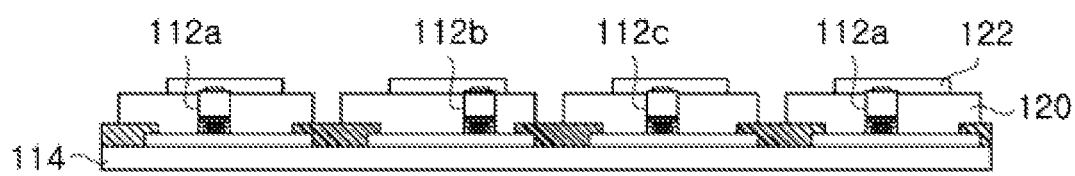

With the n-type semiconductor layer 23 and the n-type electrode 31 exposed through the upper surface of the insulation layer 120, first connection electrodes 122 may be formed on the upper surface of the insulation layer 120 to cover the n-type semiconductor layer 23 and the n-type electrodes 31, as shown in FIG. 3O. As a result, the light emitting diode part 110 according to this exemplary embodiment can be formed.

Figure 3P:
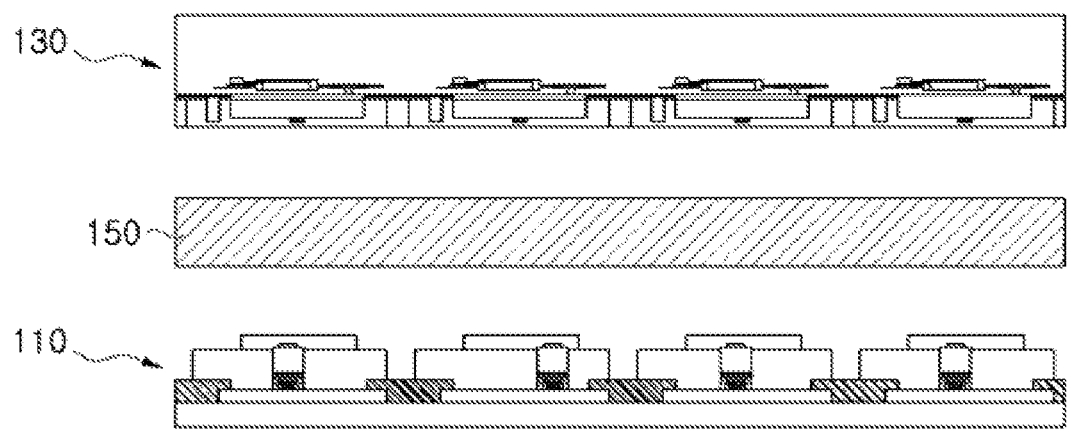

Thereafter, the light emitting diode part 110 is bonded to the TFT panel unit 130 via an anisotropic connection film, as shown in FIG. 3P, thereby providing the display apparatus 100 according to the first exemplary embodiment, as shown in FIG. 1.

Figure 5:
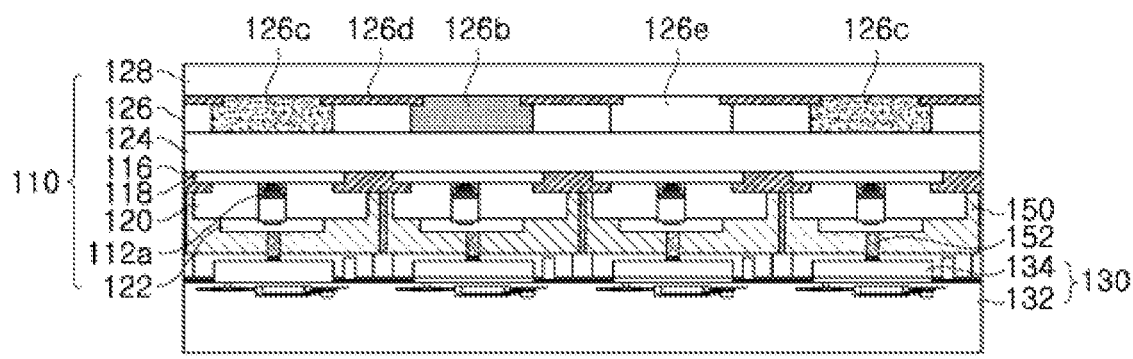
FIG. 5 is a sectional view of a display apparatus according to a second exemplary embodiment of the present disclosure.

FIG. 5 is a sectional view of a display apparatus according to a second exemplary embodiment of the present disclosure.

Referring to FIG. 5, a display apparatus 100 according to the second exemplary embodiment of the present disclosure includes a light emitting diode part 110, a TFT panel unit 130, and an anisotropic conductive film 150. Description of the same components as those of the first exemplary embodiment will be omitted.

The light emitting diode part 110 includes light emitting diodes 112, transparent electrodes 116, a blocking part 118, an insulation layer 120, first connection electrodes 122, a transparent substrate 124, a phosphor layer 126, and a protective substrate 128.

The light emitting diode part 110 includes a plurality of light emitting diodes 112, and blue light emitting diodes 112a emitting blue light may be used as the light emitting diodes 112. The blue light emitting diodes 112a are electrically connected to the transparent electrodes 116 and the blocking part 118 may be formed between the transparent electrodes 116. In addition, the transparent substrate 124 may be formed on the transparent electrode 116. The transparent substrate 124 may serve as the support substrate 114 of the display apparatus 100 according to the first exemplary embodiment. Alternatively, as in the first exemplary embodiment, after forming the light emitting diode part 110 using the support substrate 114, the support substrate 114 may be removed therefrom and the transparent substrate 124 may be formed again.

The phosphor layer 126 may be formed on an upper surface of the transparent substrate 124. The phosphor layer 126 may be formed on the blue light emitting diodes 112a such that one of a green phosphor layer 126b, a red phosphor layer 126c and a transparent layer 126e is formed thereon. In addition, a blocking layer 126d may be formed between the green phosphor layer 126b, the red phosphor layer 126c and the transparent layer 126e. The green phosphor layer 126b converts wavelengths of light emitted from the blue light emitting diode 112a such that green light can be emitted from the green phosphor layer 126b, and the red phosphor layer 126c converts wavelengths of light emitted from the blue light emitting diode 112a such that red light can be emitted from the red phosphor layer 126c. The transparent layer 126e is placed near the green phosphor layer 126b and the red phosphor layer 126c to allow blue light emitted from the blue light emitting diode 112a to pass therethrough. Accordingly, red light, green light and blue light can be emitted through the phosphor layer 126.

The protective substrate 128 may be formed on an upper surface of the phosphor layer 126. The protective substrate 128 can prevent the phosphor layer 126 from being exposed to the outside and may be formed of a transparent material as in the transparent substrate 124.

Figure 6:
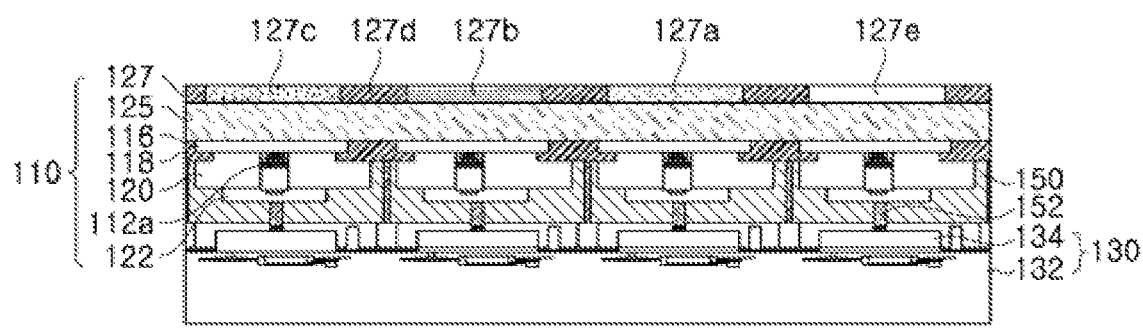
FIG. 6 is a sectional view of a display apparatus according to a third exemplary embodiment of the present disclosure.

FIG. 6 is a sectional view of a display apparatus according to a third exemplary embodiment of the present disclosure.

Referring to FIG. 6, a display apparatus 100 according to the third exemplary embodiment includes a light emitting diode part 110, a TFT panel unit 130, and an anisotropic conductive film 150. Description of the same components as those of the first exemplary embodiment will be omitted.

The light emitting diode part 110 includes light emitting diodes 112, transparent electrodes 116, a blocking part 118, a white phosphor film 125, and a color film.

The light emitting diode part 110 includes a plurality of light emitting diodes 112, and blue light emitting diodes 112a are used as in the second exemplary embodiment. The blue light emitting diodes 112a are electrically connected to the transparent electrodes 116 and the blocking part 118 may be formed between the transparent electrodes 116. The white phosphor film 125 may be formed on an upper surface of the transparent electrode 116.

The white phosphor film 125 converts blue light emitted from the blue light emitting diode 112a into white light. To this end, the white phosphor film 125 may include a green phosphor and a red phosphor.

The color filter 127 may be formed on an upper surface of the white phosphor film 125. The color filter 127 may be formed in a film shape and filters white light emitted from the white phosphor film 125 excluding one of blue light, green light and red light of the white light. The color filter 127 may include a blue light portion 127a that filters white light to allow blue light to pass therethrough, a green light portion 127b that filters white light to allow green light to pass therethrough, and a red light portion 127c that filters white light to allow red light to pass therethrough. The color filter 127 may further include a transparent portion 127e to allow white light to pass therethrough without wavelength conversion.

The blue light portion 127a, the green light portion 127b, the red light portion 127c and the transparent portion 127e may be disposed adjacent one another. Alternatively, a light blocking portion 127d may be formed between the blue light portion 127a, the green light portion 127b, the red light portion 127c and the transparent portion 127e.

Figure 7:
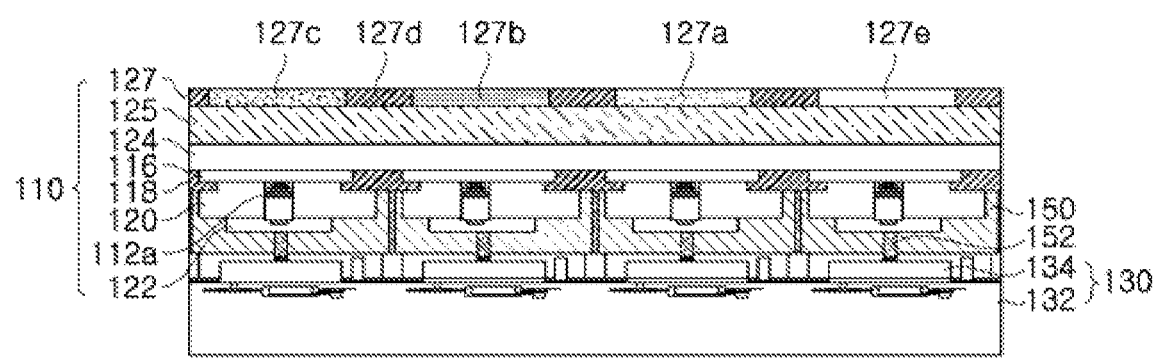
FIG. 7 is a sectional view of a display apparatus according to a fourth exemplary embodiment of the present disclosure.

FIG. 7 is a sectional view of a display apparatus according to a fourth exemplary embodiment of the present disclosure.

Referring to FIG. 7, a display apparatus 100 according to the fourth exemplary embodiment includes a light emitting diode part 110, a TFT panel unit 130, and an anisotropic conductive film 150. Description of the same components as those of the first and third exemplary embodiments will be omitted.

The light emitting diode part 110 includes light emitting diodes 112, transparent electrodes 116, a blocking part 118, a transparent substrate 124, a white phosphor film 125, and a color film.

The light emitting diode part 110 includes a plurality of light emitting diodes 112, and blue light emitting diodes 112a are used as in the second exemplary embodiment. The blue light emitting diodes 112a are electrically connected to the transparent electrodes 116 and the blocking part 118 may be formed between the transparent electrodes 116. The transparent substrate 124 may be formed on an upper surface of the transparent electrode 116.

The transparent substrate 124 may serve as the support substrate 114 of the display apparatus 100 according to the first exemplary embodiment. Alternatively, as in the first exemplary embodiment, after forming the light emitting diode part 110 using the support substrate 114, the support substrate 114 may be removed therefrom and the transparent substrate 124 may be formed again.

The white phosphor film 125 may be formed on an upper surface of the transparent electrode 116 and the color filter 127 may be formed on an upper surface of the white phosphor film 125. The white phosphor film 125 and the color filter 127 are the same as those of the display apparatus according to the third exemplary embodiment and detailed descriptions thereof will be omitted.

Figure 8:
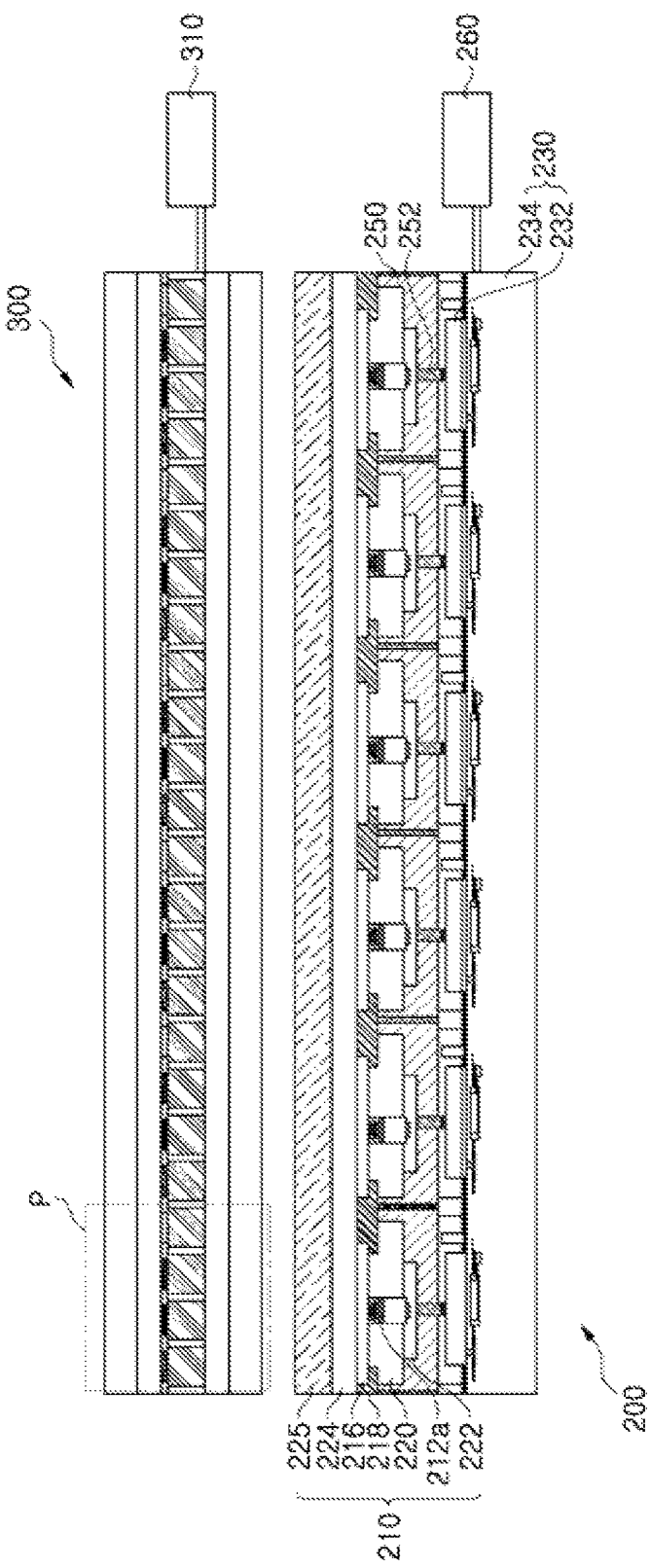
FIG. 8 is a sectional view of a display apparatus according to a fifth exemplary embodiment of the present disclosure.

Referring to FIG. 8, a display apparatus according to a fifth exemplary embodiment of the present invention includes a backlight unit 200 and a TFT-LCD panel unit 300.

The backlight unit 200 illuminates the display apparatus. In this exemplary embodiment, the backlight unit 200 has substantially the same structure as the display apparatus according to the fourth exemplary embodiment excluding the color filter 127.

A first driver 260 controls power to be applied to blue light emitting diodes 212a disposed inside the backlight unit 200. Brightness and operation of the blue light emitting diodes 212a of the backlight unit 200 can be controlled by the first driver 260.

The TFT-LCD panel unit 300 realizes a desired color when light emitted from the backlight unit 200 passes through the TFT-LCD panel unit 300. As shown in FIG. 8, the TFT-LCD panel unit 300 includes liquid crystals and color filters, which include a blue color filter configured to allow blue light to pass therethrough, a green color filter configured to allow green light to pass therethrough, a red color filter configured to allow red light to pass therethrough, and a transparent filter configured to allow white light to pass therethrough. The liquid crystals are disposed under each of the color filters and determine transmittance of light towards the color filters therethrough.

A second driver 310 may individually control the liquid crystals of the TFT-LCD panel unit 300 to allow light to pass through the liquid crystals. That is, a single pixel P includes four liquid crystals and the second driver 310 controls transmittance of light through control of each of the liquid crystals such that a desired color can be realized in the corresponding pixel P.

In this way, the second driver 310 is driven to control the TFT-LCD panel unit 300 so as to allow the TFT-LCD panel unit 300 to realize a desired image, and a control signal sent from the second driver 310 to the TFT-LCD panel unit 300 may also be sent to the first driver 260. That is, the first driver 260 can control the backlight unit 200 using the same control signal as the control signal used by the second driver 310 at the same time point. Accordingly, operation of each of the blue light emitting diodes 212a in the backlight unit 200 can be controlled through control of the first driver 260.

In this way, the first driver 260 and the second driver 310 are interlinked so as to send the same control signal. The backlight unit 200 may allow some of the plural blue light emitting diodes 212a to emit light under control of the first driver 260 and may allow light to pass through only some liquid crystals in the TFT-LCD panel unit 300 under control of the second driver 310. Accordingly, in the backlight unit 200, only some liquid crystals disposed above the blue light emitting diodes 212a, which are controlled to emit light, may be controlled to allow light to pass therethrough.

Although a typical display apparatus also includes the TFT-LCD panel unit 300 and the backlight unit 200, the backlight unit 200 of the typical display apparatus does not include a separate driver and is kept turned on during operation of the TFT-LCD panel unit 300. With this structure, the typical display apparatus has a problem of high power consumption due to operation of the backlight unit since the backlight unit 200 continues to operate except in the case where the TFT-LCD panel unit 300 is not operated. However, since the backlight unit 200 according to this exemplary embodiment is operated in association with the TFT-LCD panel unit 300, the display apparatus according to this exemplary embodiment can be controlled in a unit of the pixel P during operation of the overall display apparatus, so that the overall backlight unit 200 is not driven during operation of the display apparatus, thereby achieving reduction in power consumption.

Furthermore, since the TFT-LCD panel unit 300 controls a display screen depending upon transmittance of light therethrough, there is a limit in accurate control of brightness. However, in the display apparatus including the backlight unit 200 according to this exemplary embodiment, the backlight unit 200 supplies light, thereby achieving more accurate control of brightness than the typical display apparatus.

In the display apparatus according to the fifth exemplary embodiment, the backlight unit 200 includes the blue light emitting diodes 212a such that one blue light emitting diode corresponds to one pixel P of the TFT-LCD panel unit 300. Alternatively, the backlight unit 200 may include the blue light emitting diodes 212a such that one blue light emitting diode 212a corresponds to hundreds of pixels P (for examples, 1000 pixels or less). That is, one blue light emitting diode 212a corresponding to hundreds of pixels P is driven, thereby enabling reduction in power consumption through reduction in the number of blue light emitting diodes 212a.

Figure 9:
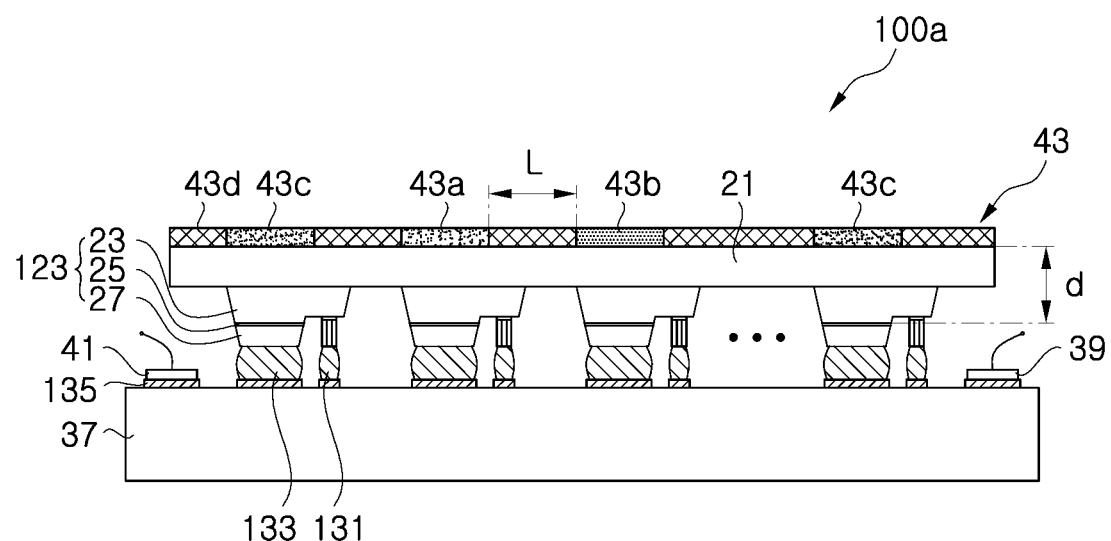
FIG. 9 is a sectional view of a display apparatus according to a sixth exemplary embodiment of the present disclosure.
Figure 10A:
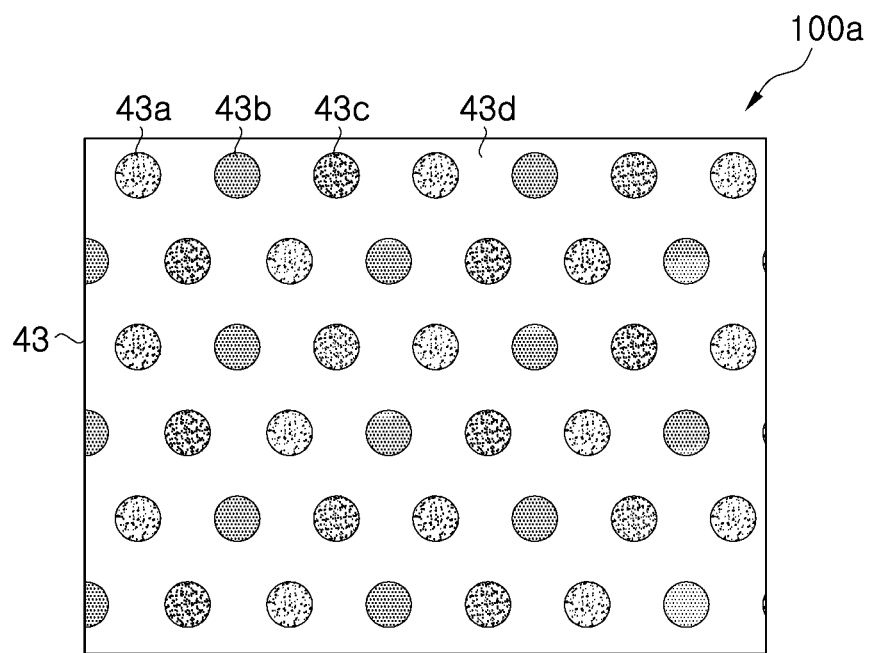
FIG. 10A and FIG. 10B are top plan views of the display apparatus according to the sixth exemplary embodiment of the present disclosure.
Figure 10B:
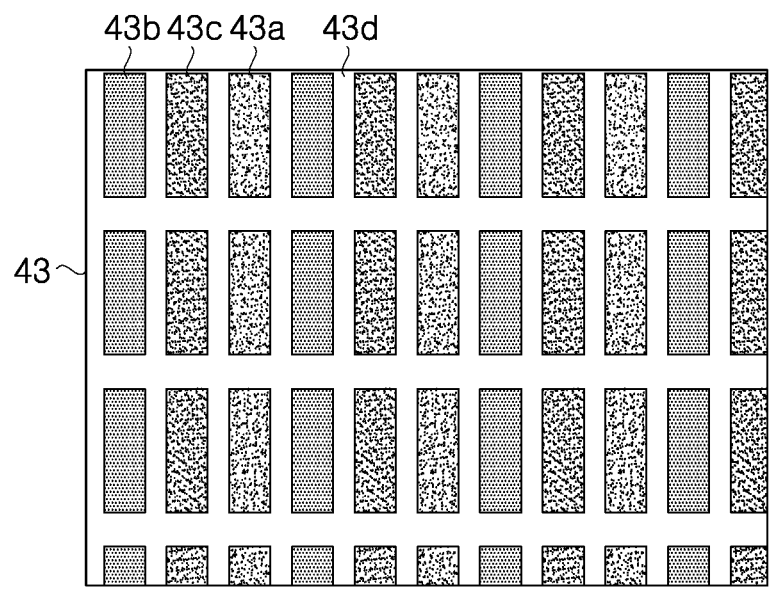

FIG. 9 is a sectional view of a display apparatus according to a sixth exemplary embodiment of the present disclosure, FIG. 10A is a top plan view of the display apparatus according to the sixth exemplary embodiment of the present disclosure, and FIG. 10B is a top plan view of a modification of the display apparatus according to the sixth exemplary embodiment of the present disclosure.

Referring to FIG. 9, FIG. 10A and FIG. 10B, a display apparatus 100a according to the sixth exemplary embodiment includes a growth substrate 21, light emitting structures 123, n-type bumps 131, p-type bumps 133, a support substrate 37, and a wavelength conversion part 43.

The growth substrate 21 may be selected from among any substrates allowing growth of nitride semiconductor layers thereon and may be an insulation or conductive substrate. By way of example, the growth substrate 21 may be a sapphire substrate, a silicon substrate, a silicon carbide substrate, an aluminum nitride substrate, or a gallium nitride substrate. In this exemplary embodiment, the growth substrate 21 may be a sapphire substrate and may include a C-plane as a growth plane on which nitride semiconductor layers are grown.

The growth substrate 21 may be formed of a transparent material in order to allow light emitted from nitride semiconductor layers grown thereon to be emitted to the outside through the growth substrate 21. The growth substrate 21 may be formed as thin as possible so as to have a thickness of about 50 μm to 100 a μm, and then may be removed from the display apparatus 100a by laser beams, as will be described below.

Each of the light emitting structures 123 includes an n-type semiconductor layer 23, an active layer 25 disposed on the n-type semiconductor layer 23, and a p-type semiconductor layer 27 disposed on the active layer 25. The n-type semiconductor layer 23, the active layer 25 and the p-type semiconductor layer 27 may include a Group III-V based compound semiconductor, for example, a nitride semiconductor such as (Al, Ga, In)N. In other exemplary embodiments, locations of the n-type semiconductor layer 23 and the p-type semiconductor layer 27 can be interchanged.

The n-type semiconductor layer 23 may include an n-type dopant (for example, Si) and the p-type semiconductor layer 27 may include a p-type dopant (for example, Mg). The active layer 25 may have a multi-quantum well (MQW) structure and a composition of the active layer may be determined so as to emit light having a desired peak wavelength. In this exemplary embodiment, the active layer 25 may be configured to emit blue light or UV light.

As shown in FIG. 9, the light emitting structure 123 may include a partially exposed region of the n-type semiconductor layer 23, which is formed by partially removing the p-type semiconductor layer 27 and the active layer 25. An n-type electrode pad may be placed on the exposed region of the n-type semiconductor layer 23 and a p-type electrode pad may be placed on the p-type semiconductor layer 27.

Although the light emitting structure 123 uses a flip-chip type light emitting diode in this exemplary embodiment, it should be understood that a vertical type light emitting diode or a lateral type light emitting diode may also be used. In the sixth exemplary embodiment, each of the light emitting structures may have a size of about 2 μm to 50 μm.

In addition, as shown in FIG. 9, a plurality of light emitting structures 123 may be grown in a predetermined pattern on the growth substrate. That is, the plurality of light emitting structures 123 may be grown on the growth substrate 21 such that a red light portion 43a, a green light portion 43b and a blue light portion 43c are disposed on the plurality of light emitting structures 123, as shown in FIG. 10A and FIG. 10B. As such, each of the light emitting structures 123 grown on the growth substrate 21 may be used as a single light emitting diode. As a result, the plurality of light emitting diodes may be arranged on the growth substrate 21 to form an array of light emitting diodes. The array of light emitting diodes is simultaneously grown on the growth substrate 21 and includes a plurality of light emitting diodes arranged in a predetermined pattern on a plane of the growth substrate 21.

The support substrate 37 is a substrate on which the plurality of light emitting structures 123 is mounted, and may include a plurality of conductive patterns 135 formed on an upper surface thereof. The support substrate 37 may be an insulation substrate, a conductive substrate, or a circuit board. By way of example, the support substrate 37 may be a sapphire substrate, a gallium nitride substrate, a glass substrate, a silicon carbide substrate, a silicon substrate, a metal substrate, or a ceramic substrate. The support substrate 37 is formed on the upper surface thereof with the plurality of conductive patterns 135 to be electrically connected to the light emitting structures 123 and may include a circuit pattern therein.

The conductive patterns 135 may be formed on the upper surface of the support substrate 37 to be electrically connected to the plurality of light emitting diodes, respectively, and the plurality of light emitting diodes may be electrically connected to each other via the circuit pattern formed inside the substrate.

Further, an n-type substrate electrode 39 and a p-type substrate electrode 41 may be respectively formed on one or more conductive patterns of the plural conductive patterns 135 to be electrically connected to an external power source.

As such, the support substrate 37 having the conductive patterns 135 formed thereon may be coupled to the growth substrate 21 having the light emitting structures 123 grown thereon. That is, the growth substrate 21 having the light emitting structures 123 used as the light emitting diodes is turned upside down and electrically connected to the support substrate 37 such that the light emitting structures 123 electrically contact the conductive patterns 135 formed on the upper surface of the support substrate 37. As a result, the plurality of light emitting structures 123 is electrically connected to the plurality of conductive patterns 135.

The plurality light emitting structures 123 may be coupled to the plurality of conductive patterns 135 via the n-type bumps 131 and the p-type bumps 133, respectively. Each of the n-type bumps 131 is formed at a side of the n-type semiconductor layer 23 to be electrically connected to the exposed n-type semiconductor layer 23 of the light emitting structure 123, and each of the p-type bumps 133 is formed at a side of the p-type semiconductor layer 27 to be electrically connected to the p-type semiconductor layer 27. With this structure, the light emitting structures 123 may be electrically connected to the plurality of conductive patterns 135, respectively.

The n-type bumps 131 and the p-type bumps 133 serve to couple the light emitting structures 123 to the support substrate 37, and may include a metallic material to allow the plurality of light emitting structures 123 and the plurality of conductive patterns 135 to be electrically connected to each other therethrough.

Thus, the growth substrate 21 having the light emitting structures 123 grown thereon may be coupled to the support substrate 37 having the conductive patterns 135 formed thereon via the n-type bumps 131 and the p-type bumps 133, such that the plurality of light emitting structures 123 is placed under the growth substrate 21, as shown in FIG. 9.

As described above, the wavelength conversion part 43 is disposed on an upper surface of each of the light emitting structures 123 in the structure wherein the light emitting structures 123 are coupled to the support substrate 37. Specifically, as shown in FIG. 9, in the structure wherein the growth substrate 21 is disposed on the light emitting structures 123, the wavelength conversion part 43 may be disposed on the upper surface of the growth substrate 21.

In the sixth exemplary embodiment, the wavelength conversion part 43 may be formed in a film shape and may include the red light portion 43a, which converts light emitted from the plurality of light emitting structures 123 into red light, the green light portion 43b, which converts light emitted from the plurality of light emitting structures 123 into green light, and the blue light portion 43c, which converts light emitted from the plurality of light emitting structures 123 into blue light. Here, if light emitted from the plurality of light emitting structures 123 is blue light, there is no need for a separate blue light portion 43c. Thus, the wavelength conversion part 43 may include a transparent portion so as to allow light emitted from the light emitting structure 123 disposed at a location of the blue light portion 43c to pass therethrough without being subjected to wavelength conversion.

If light emitted from the plurality of light emitting structures 123 is UV light, the wavelength conversion part 43 may include the red light portion 43a, the green light portion 43b, and the blue light portion 43c. In this structure, each of the red light portion 43a, the green light portion 43b and the blue light portion 43c may include phosphors for converting the wavelengths of light emitted from the light emitting structures 123.

That is, the red light portion 43a may include at least one of quantum dot phosphors, sulfide phosphors and fluoride phosphors in order to convert light emitted from the corresponding light emitting structure 123 into red light having a peak wavelength of 610 nm to 650 nm. The fluoride-based phosphors may be phosphors represented by Formula $A_2MF_6:MN^{4+}$, wherein A is one of Li, Na, K, Ba, Rb, Cs, Mg, Ca, Se and Zn and M is one of Ti, Si, Zr, Sn and Ge. The green light portion 43b may include at least one of BAM (Ba—Al—Mg) phosphors, quantum dot phosphors, silicate phosphors, bata-SiAlON phosphors, garnet phosphors, LSN phosphors and fluoride phosphors in order to convert light emitted from the light emitting structure 123 into green light having a peak wavelength of 500 nm to 570 nm. If light emitted from the plurality of light emitting structures 123 is UV light, the blue light portion 43c may include phosphors capable of converting UV light into blue light having a peak wavelength of 460 nm to 480 nm.

In this exemplary embodiment, the red light portion 43a, the green light portion 43b and the blue light portion 43c may be restrictively formed only on the upper surfaces of the light emitting structures 123, as shown in FIG. 10(a. That is, in the wavelength conversion part 43 formed in a film shape, the red light portion 43a, the green light portion 43b and the blue light portion 43c may be arranged corresponding to the arrangement pattern of the plurality of light emitting structures 123 in plan view.

As such, light emitted from the plurality of light emitting structures 123 is subjected to wavelength conversion through the wavelength conversion part 43 having the red light portion 43a, the green light portion 43b and the blue light portion 43c distributed therein to emit red light, green light and blue light at the corresponding locations. In this exemplary embodiment, the wavelength conversion part 43 includes a blocking portion 43d blocking light emitted from the light emitting structures 123 and formed where the red light portion 43a, the green light portion 43b and the blue light portion 43c are not distributed. In this structure, light emitted from the plurality of light emitting structures 123 can be subjected to wavelength conversion only through the red light portion 43a, the green light portion 43b and the blue light portion 43c before discharge to the outside, and the blocking portion 43d can prevent light emitted from adjacent light emitting structures 123 from mixing with each other.

As described above, the wavelength conversion part 43 is formed in a film shape in which the red light portion 43a, the green light portion 43b, the blue light portion 43c, and the blocking portion 43d are disposed on a coplanar surface, whereby light emitted from the plurality of light emitting structures 123 can be discharged to the outside only through the red light portion 43a, the green light portion 43b and the blue light portion 43c.

Each of the red light portion 43a, the green light portion 43b and the blue light portion 43c may be formed in a circular shape so as to be formed only on the upper surfaces of the light emitting structures 123 in plan view, as shown in FIG. 10A, or may have a rectangular shape in plan view, as shown in FIG. 10B. This structure allows one or more light portions among the red light portion 43a, the green light portion 43b and the blue light portion 43c to be disposed on the upper surfaces of one or more light emitting structures 123.

In this structure, since the growth substrate 21 is a transparent substrate, light emitted from the plurality of light emitting structures 123 can be discharged through a side surface of the growth substrate 21 while passing through the transparent growth substrate 21. As a result, light emitted from one light emitting structure 123 can also be discharged not only to the red light portion 43a, but also to the green light portion 43b or the blue light portion 43c. Thus, in order to prevent this problem, the blocking portion 43d may be disposed between the red light portion 43a, the green light portion 43b and the blue light portion 43c. In addition, a separation distance (L) between the red light portion 43a, the green light portion 43b and the blue light portion 43c must not be greater than a distance (d) from the active layer of the light emitting structure 123, through which light is emitted, to the wavelength conversion part 43. In this way, with the structure wherein the separation distance (L) is greater than or equal to the distance (d), the display apparatus can minimize interference of light spreading in a lateral direction from the growth substrate 21.

Figure 11:
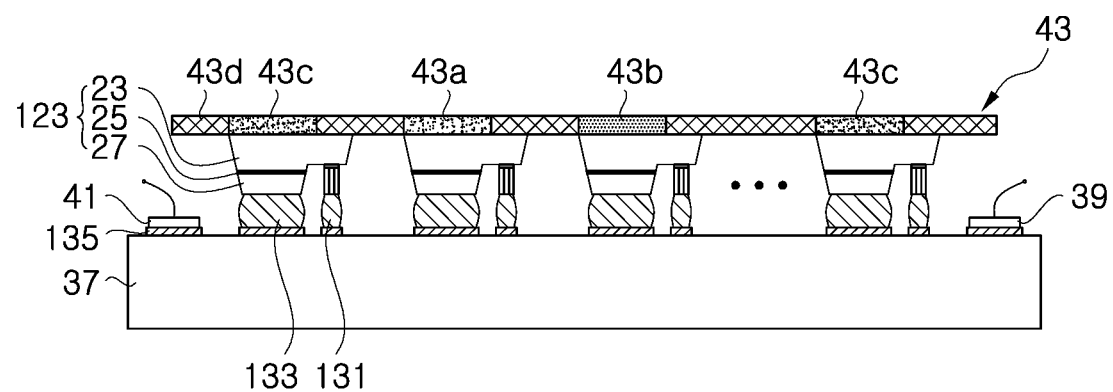
FIG. 11 is a sectional view of a display apparatus according to a seventh exemplary embodiment of the present disclosure.

FIG. 11 is a sectional view of a display apparatus according to a seventh exemplary embodiment of the present disclosure.

Referring to FIG. 11, a display apparatus 100a according to the seventh exemplary embodiment includes light emitting structures 123, n-type bumps 131, p-type bumps 133, a support substrate 37, and a wavelength conversion part 43. Description of the same components as those of the sixth exemplary embodiment will be omitted.

As described in the sixth exemplary embodiment, since light emitted from the light emitting structures 123 is discharged to the wavelength conversion part 43 through the growth substrate 21, light emitted from the plurality of light emitting structures 123 can be mixed while passing through the growth substrate 21. Accordingly, in the seventh exemplary embodiment, the growth substrate 21 is removed and the wavelength conversion part 43 may be formed on an upper surface of the light emitting structure 123. In this structure, the distance from the active layer 25 of the light emitting structure 123 to the wavelength conversion part 43 is decreased as compared with that in the sixth exemplary embodiment, light emitted from the light emitting structure 123 can be directly discharged to the wavelength conversion part 43.

In the seventh exemplary embodiment, the wavelength conversion part 43 may have a film shape including the red light portion 43a, the green light portion 43b, the blue light portion 43c, and the blocking portion 43d, as in the sixth exemplary embodiment.

In addition, the plural light emitting structures 123 are arranged on the support substrate 37 to form an array of light emitting diodes, as in the sixth exemplary embodiment.

Figure 12:
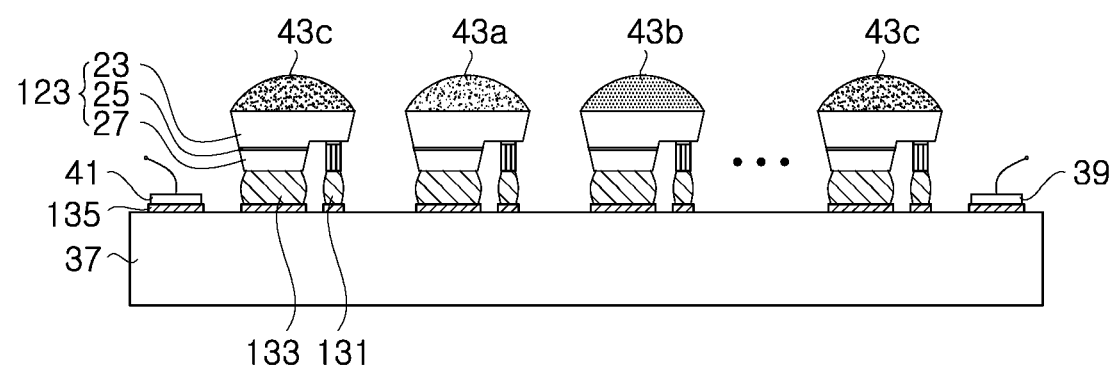
FIG. 12 is a sectional view of a display apparatus according to a eighth exemplary embodiment of the present disclosure.

FIG. 12 is a sectional view of a display apparatus according to a eighth exemplary embodiment of the present disclosure.

Referring to FIG. 12, a display apparatus 100a according to the eighth exemplary embodiment includes light emitting structures 123, n-type bumps 131, p-type bumps 133, a support substrate 37, and a wavelength conversion part 43. Description of the same components as those of the sixth exemplary embodiment will be omitted.

In the display apparatus 100a according to the eighth exemplary embodiment, the growth substrate 21 is removed and the wavelength conversion part 43 is formed on an upper surface of the light emitting structure 123, as in the seventh exemplary embodiment. However, unlike the seventh exemplary embodiment, in the wavelength conversion part 43 according to the eighth exemplary embodiment, one of the red light portion 43a, the green light portion 43b and the blue light portion 43c may be directly formed on the upper surface of each of the light emitting structures 123. Thus, in the wavelength conversion part 43 according to the eighth exemplary embodiment, the red light portion 43a, the green light portion 43b and the blue light portion 43c may be separated from each other and a separate blocking portion 43d may be omitted.

Further, if the light emitting structure 123 is a UV light emitting diode configured to emit UV light, the wavelength conversion part 43 may include the blue light portion 43c configured to convert UV light into blue light, and if the light emitting structure 123 is a blue light emitting diode configured to emit blue light, a separate wavelength conversion part 43 may not be formed on the upper surface of the blue light emitting diode. In some exemplary embodiments, a transparent resin may be formed on the upper surface of the blue light emitting diode to prevent wavelength conversion of light.

In addition, the plural light emitting structures 123 are arranged on the support substrate 37 to form an array of light emitting diodes, as in the sixth exemplary embodiment.

Figure 13:
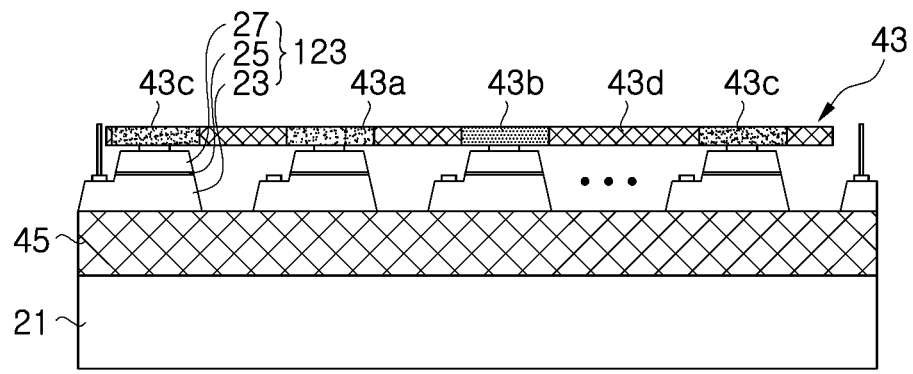
FIG. 13 is a sectional view of a display apparatus according to a ninth exemplary embodiment of the present disclosure.

FIG. 13 is a sectional view of a display apparatus according to a ninth exemplary embodiment of the present disclosure.

Referring to FIG. 13, a display apparatus 100a according to the ninth exemplary embodiment includes a growth substrate 21, a high resistance layer 45, light emitting structures 123, and a wavelength conversion part 43. Description of the same components as those of the sixth exemplary embodiment will be omitted.

In the ninth exemplary embodiment, the light emitting structures 123 may be grown on an upper surface of the growth substrate 21, which may be formed of an opaque material such as Si. With this structure, the display apparatus can minimize mixing of light emitted from the light emitting structures 123 before reaching the wavelength conversion part 43.

In addition, the high resistance layer 45 is formed on the upper surface of the growth substrate 21 and the light emitting structures 123 are formed on an upper surface of the high resistance layer 45, whereby the high resistance layer 45 can secure insulation between the light emitting structures 123 even in the case where the growth substrate 21 exhibits conductivity. In addition, the plural light emitting structures 123 are arranged on the support substrate 37 to form an array of light emitting diodes, as in the sixth exemplary embodiment.

Figure 14:
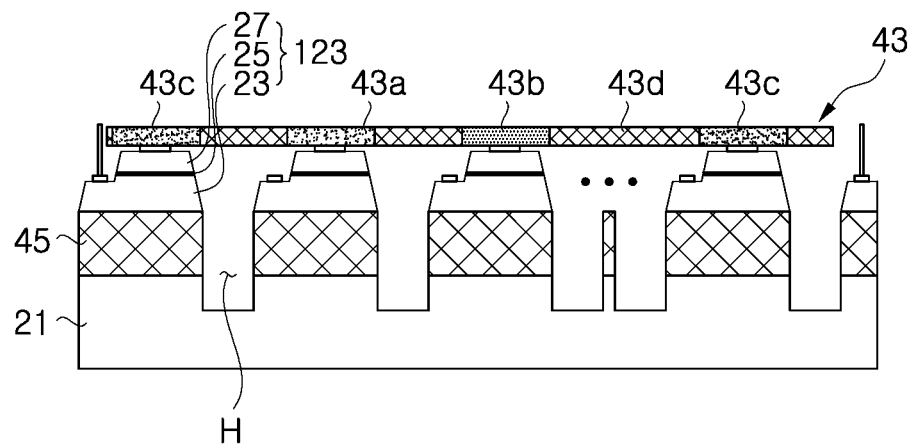
FIG. 14 is a sectional view of a display apparatus according to a tenth exemplary embodiment of the present disclosure.

FIG. 14 is a sectional view of a display apparatus according to a tenth exemplary embodiment of the present disclosure.

Referring to FIG. 14, a display apparatus 100a according to the tenth exemplary embodiment includes a growth substrate 21, a high resistance layer 45, light emitting structures 123, and a wavelength conversion part 43. Description of the same components as those of the sixth exemplary embodiment will be omitted.

In the display apparatus 100a according to the tenth exemplary embodiment, the high resistance layer 45 is formed on an upper surface of the opaque growth substrate 21, and the light emitting structures 123 are formed on an upper surface of the high resistance layer 45, as in the ninth exemplary embodiment. In addition, a plurality of trenches H may be formed on the high resistance layer 45 and the growth substrate 21 to be placed between the light emitting structures 123. The plurality of trenches H may be formed by etching and may completely isolate the light emitting structures 123 from each other so as to secure insulation therebetween. In addition, the plural light emitting structures 123 are arranged on the support substrate 37 to form an array of light emitting diodes, as in the sixth exemplary embodiment.

Figure 15:
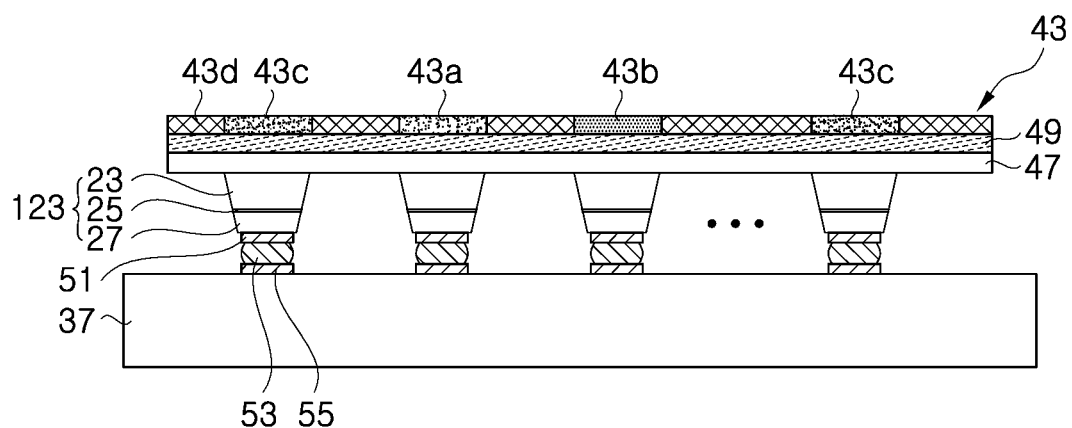
FIG. 15 is a sectional view of a display apparatus according to a eleventh exemplary embodiment of the present disclosure.

FIG. 15 is a sectional view of a display apparatus according to a eleventh exemplary embodiment of the present disclosure.

Referring to FIG. 15, a display apparatus according to the eleventh exemplary embodiment may include a transparent electrode 47, light emitting structures 123, a support substrate 37, a white phosphor film 49, and a wavelength conversion part 43. Description of the same components as those of the sixth exemplary embodiment will be omitted.

In the display apparatus 100a according to the eleventh exemplary embodiment, the light emitting structures 123 are grown on an upper surface of the growth substrate 21 and electrode pads 51 are formed on upper surfaces of the light emitting structures 123, as in the first exemplary embodiment. In addition, with the growth substrate 21 turned upside down, the light emitting structures 123 are coupled to the support substrate 37 having substrate electrodes 55 formed on an upper surface thereof such that the electrode pads 51 are electrically connected to the support substrate 37 via bumps 53. The growth substrate 21 can be removed later and the transparent electrode 47 may be disposed on the upper surfaces of the light emitting structures 123 from which the growth substrate 21 is removed. As a result, as shown in FIG. 15, there is provided a structure wherein the light emitting structures 123 are mounted on the support substrate 37 and the transparent electrode 47 is formed on the light emitting structures 123.

In addition, the plural light emitting structures 123 are arranged on the support substrate 37 to form an array of light emitting diodes, as in the sixth exemplary embodiment. The plural light emitting structures 123 may form an array of flip-chip type light emitting diodes or an array of vertical type light emitting diodes.

In the structure shown in FIG. 15, the white phosphor film 49 is formed on the growth substrate 21 to convert light emitted from the light emitting structures 123 into white light and the wavelength conversion part 43 is formed on the upper surface of the white phosphor film 49. Although the white phosphor film 49 is illustrated as having a film shape in this exemplary embodiment, other implementations are also possible as needed.

In the eleventh exemplary embodiment, the light emitting structures 123 are light emitting diodes configured to emit blue light or UV light as in the sixth exemplary embodiment, and the white phosphor film 49 converts blue light or UV light emitted from the light emitting structures 123 into white light. Accordingly, light emitted through the white phosphor film 49 may be converted into red light through the red light portion 43a of the wavelength conversion part 43, green light through the green light portion 43b thereof, and blue light through the blue light portion 43c thereof.

In addition, the wavelength conversion part 43 includes a blocking portion 43d formed between the red light portion 43a, the green light portion 43b and the blue light portion 43c to block light emitted through the white phosphor film 49 from being discharged to other regions excluding the red light portion 43a, the green light portion 43b, and the blue light portion 43c.

With the light emitting structures 123 coupled to the support substrate 37, the growth substrate 21 may be separated from the light emitting structures 123 before formation of the white phosphor film 49, as in the seventh exemplary embodiment. The growth substrate 21 is a transparent substrate and is removed from the light emitting structures, thereby preventing light emitted from the light emitting structures 123 from being mixed with each other in the growth substrate 21 before conversion into white light in the white phosphor film 49.

The support substrate 37 may be a hard substrate, a flexible substrate, or a stretchable substrate. Alternatively, the support substrate 37 may be a printed circuit board (PCB) having integrated circuits printed thereon. By way of example, the support substrate may be a Si CMOS IC or an organic IC.

As described above, in order to mount the light emitting structures on a flexible substrate, the growth substrate 21 is removed from the light emitting structures by laser lift-off, wet etching or the like, and then the wavelength conversion part is printed on or attached in the form of a film to the upper surfaces of the light emitting structures. As a result, since the light emitting structures coupled to an upper surface of the flexible support substrate are separated from each other, the shape of the display apparatus can be conveniently modified as needed.

For the display apparatus according to the eleventh exemplary embodiment, formation of the white phosphor film 49 on the upper surfaces of the light emitting structures 123 is more advantageous in terms of manufacturing process than formation of a phosphor layer on an upper surface of each of the light emitting structures 123. Since the plurality of light emitting structures 123 has a micrometer scale, formation of the phosphor layer on the upper surface of each of the light emitting structures 123 provides a difficult manufacturing process.

In addition, formation of the white phosphor film 49 on the entire upper surfaces of the plural light emitting structures 123 is more advantageous in terms of color reproduction of the display apparatus through color mixing and diffusion than formation of the wavelength conversion part 43 alone on the upper surfaces of the plural light emitting structures 123.

FIGS. 16A, 16B, 16C, and 16D are sectional views of a display apparatus according to a twelfth exemplary embodiment of the present disclosure. Particularly, FIG. 16A to FIG. 16D are sectional views of a process of forming a wavelength conversion part of the display apparatus according to the twelfth exemplary embodiment.

Referring to FIG. 16A to FIG. 16D, the display apparatus according to the twelfth exemplary embodiment includes light emitting structures 123, n-type bumps 131, p-type bumps 133, a support substrate 37, a transparent member T, and a wavelength conversion part 43. Description of the same components as those of the above exemplary embodiments will be omitted.

In the display apparatus 100a according to the eleventh exemplary embodiment, a plurality of light emitting structures 123 is grown on an upper surface of the growth substrate 21 and is then coupled to the support substrate 37 on which a plurality of conductive patterns 135 is formed, as in the above exemplary embodiments. After the plurality of light emitting structures 123 is coupled to the support substrate 37, the growth substrate 21 is removed from the light emitting structures, and the transparent member T is formed on upper surfaces of the plurality of light emitting structures 123. Thereafter, a blocking portion 43d is formed on an upper surface of the transparent member T to prevent color mixing, and a mask pattern M is formed on an upper surface of the blocking portion 43d to form a red light portion 43a, a green light portion 43b and a blue light portion 43c. Although the following description will focus on the formation of the red light portion 43a, the green light portion 43b and the blue light portion 43c may also be formed by the same process.

Figure 16A:
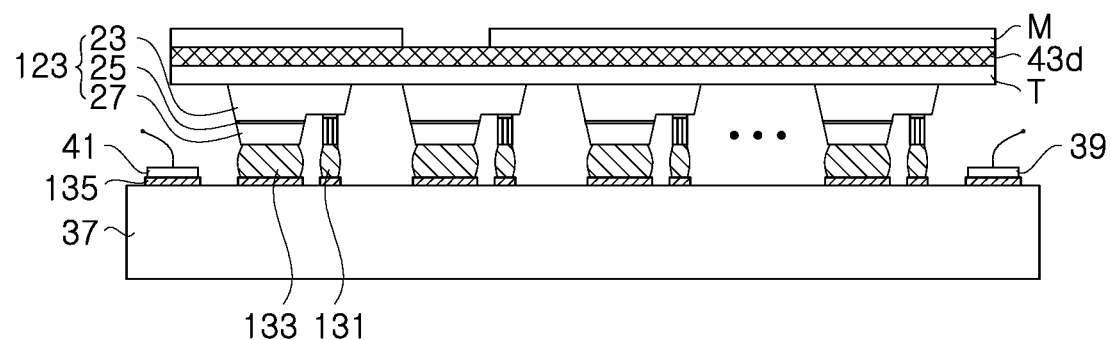
FIGS. 16A, 16B, 16C, and 16D are a sectional view of a display apparatus according to a twelfth exemplary embodiment of the present disclosure.

FIG. 16A shows a mask pattern M formed on the blocking portion. As described in the above exemplary embodiment, the blocking portion 43d is formed on the transparent member T to prevent light emitted from the light emitting structures 123 from mixing. Further, in order to form the red light portion 43a, the green light portion 43b and the blue light portion 43c, the mask pattern M is formed on the blocking portion 43d. As shown in FIG. 16A, the mask pattern M is formed on the blocking portion 43d excluding a region of the blocking portion 43d corresponding to an upper surface of the light emitting structure 123, on which the red light portion 43a will be formed, and part of the blocking portion 43d is etched.

Figure 16B:
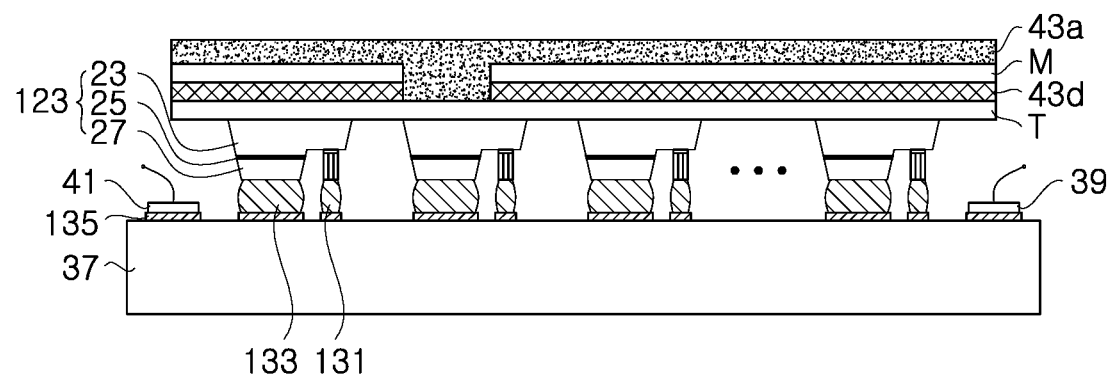

Then, as shown in FIG. 16B, after etching the blocking portion 43d, a liquid containing red phosphors is deposited over the entire upper surface of the mask pattern M in order to form the red light portion 43a, followed by curing. The deposited liquid can fill an etched region of the blocking portion 43d.

Figure 16C:
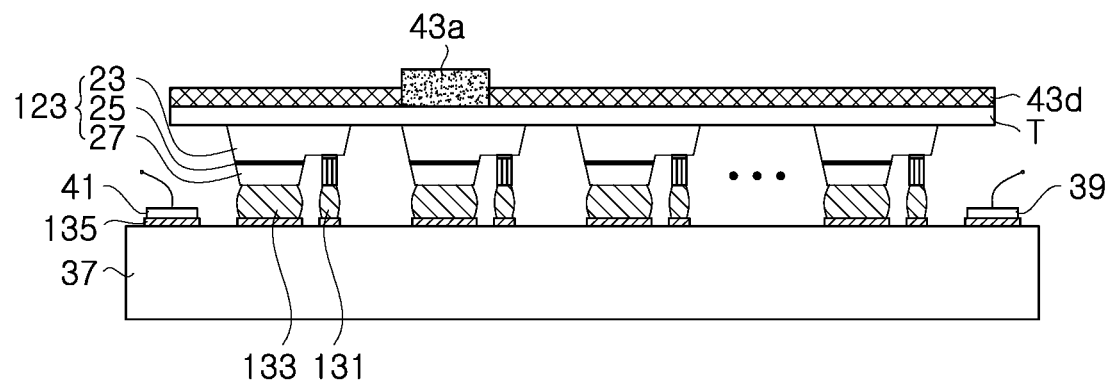

After completion of curing the red phosphor containing liquid deposited on the mask pattern, the cured liquid is removed together with the mask pattern M from the blocking portion 43d excluding a region of the blocking portion 43d subjected to etching. As a result, the red light portion 43a can be formed as shown in FIG. 16C.

Figure 16D:
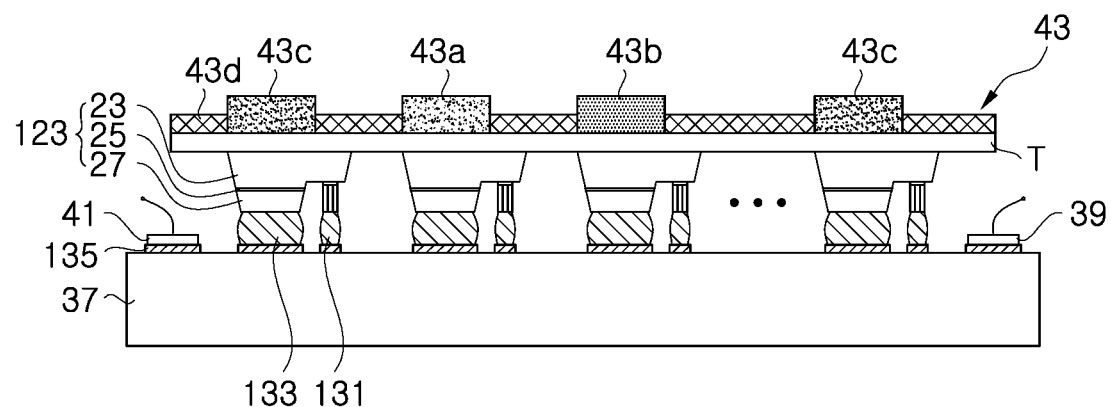

The green light portion 43b and the blue light portion 43c can also be formed by repeating the above processes, thereby forming a display apparatus as shown in FIG. 16D. As a result, light emitted from the light emitting structures 123 can be discharged to the outside only through the red light portion 43a, the green light portion 43b and the blue light portion 43c.

In this exemplary embodiment, the transparent member T may be a transparent film or a sapphire substrate, which is the growth substrate 21 through which light emitted from each of the light emitting structures 123 can pass, or the transparent electrode 47 which exhibits conductivity.

FIGS. 17A, 17B, 17C, 17D, 17E, and 17F show sectional views of a display apparatus according to a thirteenth exemplary embodiment of the present disclosure. FIGS. 17A-17F are sectional views illustrating a process of manufacturing the display apparatus according to the thirteenth exemplary embodiment, in which a plurality of light emitting structures grown on a growth substrate is coupled to a support substrate after adjustment of separation distances between the light emitting structures using a stretchable sheet SS.

The display apparatus according to the thirteenth exemplary embodiment includes light emitting structures 123, n-type bumps, p-type bumps, a support substrate 37, and a wavelength conversion part. Description of the same components as those of the above exemplary embodiments will be omitted. The following description will focus on a process of coupling light emitting structures 123 grown on the growth substrate 21 to the support substrate 37 with reference to FIGS. 17A-17F.

The light emitting structure 123 may include a partially exposed region of the n-type semiconductor layer, which is formed by partially removing the p-type semiconductor layer and the active layer. An n-type electrode pad may be placed on the exposed region of the n-type semiconductor layer and a p-type electrode pad may be placed on the p-type semiconductor layer.

Although the light emitting structure 123 uses a flip-chip type light emitting diode in this exemplary embodiment, it should be understood that a vertical type light emitting diode or a lateral type light emitting diode may also be used.

The growth substrate 21 may be selected from among any substrates allowing growth of nitride semiconductor layers thereon and may be an insulation or conductive substrate. By way of example, the growth substrate 21 may be a sapphire substrate, a silicon substrate, a silicon carbide substrate, an aluminum nitride substrate, or a gallium nitride substrate. In this exemplary embodiment, the growth substrate 21 may be a sapphire substrate and may include a C-plane as a growth plane on which nitride semiconductor layers are grown.

Figure 17A:
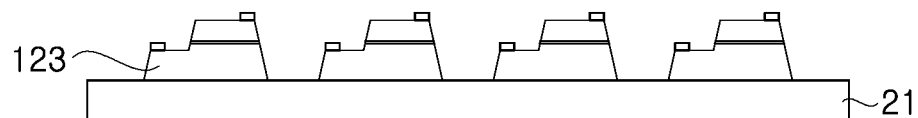
FIGS. 17A, 17B, 17C, 17D, 17E, and 17F show sectional views of a display apparatus according to a thirteenth exemplary embodiment of the present disclosure.

As shown in FIG. 17A, the plurality of light emitting structures 123 is grown on the growth substrate 21. In this exemplary embodiment, the plural light emitting structures 123 are arranged in a predetermined pattern on the growth substrate 21 and are separated from each other during growth.

Figure 17B:
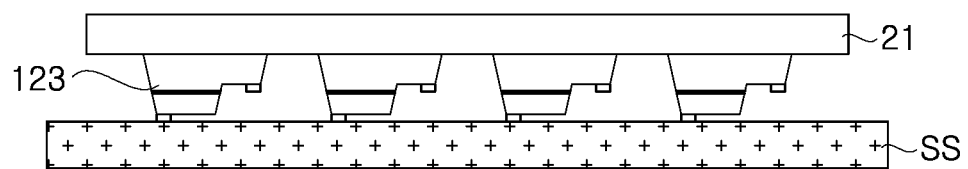
Figure 17C:
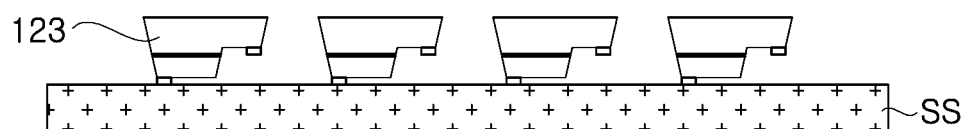

With the growth substrate 21 turned upside down, the light emitting structures 123 grown on the growth substrate 21 are coupled to an upper surface of the stretchable sheet, as shown in FIG. 17B. In addition, after the plurality of light emitting structures 123 is coupled to the stretchable sheet SS, the growth substrate 21 is removed from the light emitting structures by LLO and the like, as shown in FIG. 17C.

Figure 17D:
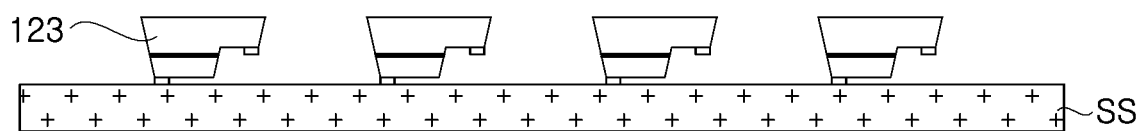

Thereafter, as shown in FIG. 17D, since the stretchable sheet SS can be two-dimensionally stretched or compressed, the separation distances between the light emitting structures 123 can be adjusted by stretching or compressing the stretchable sheet SS. FIG. 17D shows one example in which the separation distances between the light emitting structures 123 are enlarged by stretching the stretchable sheet SS. In one embodiment, the stretchable sheet SS may be a blue sheet.

Figure 17E:
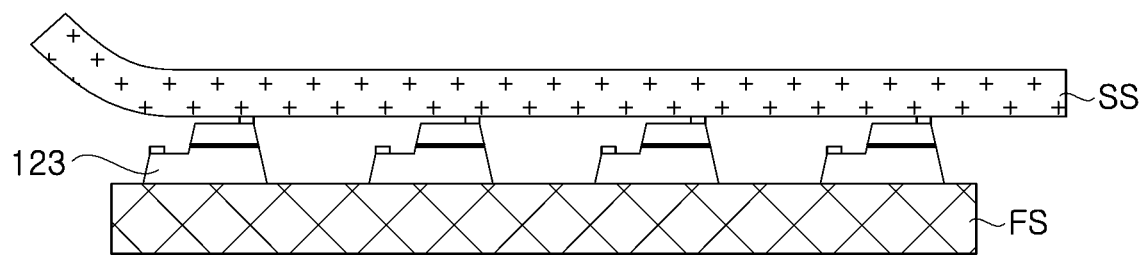

In this way, the stretchable sheet SS is turned upside down in a stretched state and coupled to a fixing sheet FS via the light emitting structures 123 such that the light emitting structures 123 are coupled to the fixing sheet. This state is shown in FIG. 17E, and after the plurality of light emitting structures 123 is coupled to the fixing sheet FS, the stretchable sheet SS is removed from the upper surfaces of the plurality of light emitting structures 123. In this exemplary embodiment, since the stretchable sheet SS can be uniformly stretchable in two dimensions, the distances between the plural light emitting structures 123 can be uniformly widened. The distances between the plural light emitting structures 123 can be adjusted in various ways as needed. The fixing sheet FS serves to fix the locations of the light emitting structure 123 in order to maintain the distances between the plural light emitting structures 123 adjusted by the stretchable sheet SS.

Figure 17F:
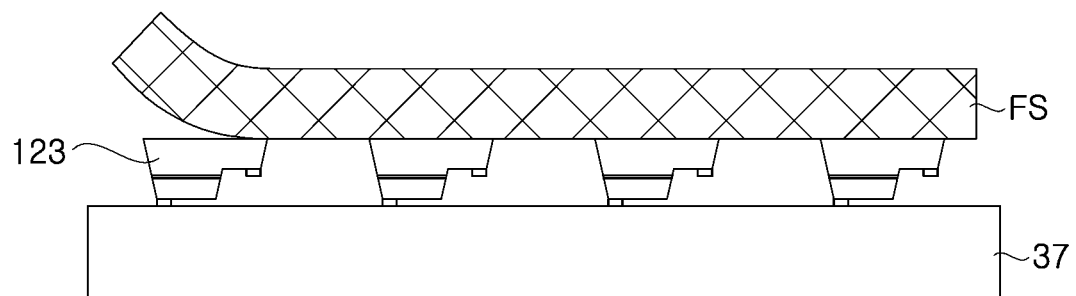

After each of the light emitting structures 123 is coupled to the fixing sheet FS, the plurality of light emitting structures 123 is coupled to the support substrate 37 and the fixing sheet FS is removed from the light emitting structures, as shown in FIG. 17F. In this exemplary embodiment, the support substrate 37 includes conductive patterns or interconnection circuits, and may be a general PCB, a flexible substrate, or a stretchable substrate like the stretchable sheet SS.

As described above, since the separation distances between the plural light emitting structures 123 may be adjusted using the stretchable sheet SS, the light emitting structures 123 may be simultaneously transferred to the support substrate after uniformly increasing the distances therebetween. Accordingly, the plurality of light emitting structures 123 used in the display apparatus according to the present disclosure may also be used not only in a small wearable apparatus, but also in a large display.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display apparatus, comprising:
a transparent substrate;
a panel substrate;
a light emitting diode disposed between the transparent substrate and the panel substrate;
an insulation layer disposed directly on side surfaces of the light emitting diode and covering the side surfaces of the light emitting diode;
a first connection electrode electrically connected to the light emitting diode and disposed on the insulation layer between the insulation layer and the panel substrate;
a second connection electrode on the panel substrate; and
an electrode connector electrically connecting the first connection electrode to the second connection electrode,
wherein the first connection electrode has an overlapping portion overlapping with the light emitting diode and a non-overlapping portion laterally extending from the overlapping portion on the insulation layer.

2. The display apparatus of claim 1, wherein the insulation layer has a width larger than a width of the first connection electrode.

3. The display apparatus of claim 2, wherein the first insulation layer has a flat surface and the non-overlapping portion is disposed on the flat surface of the insulation layer.

4. The display apparatus of claim 1, wherein a plurality of light emitting diodes are disposed on the panel substrate.

5. The display apparatus of claim 4, wherein each of the light emitting diodes comprises an n-type semiconductor layer, a p-type semiconductor layer, and an active layer interposed between the n-type semiconductor layer and the p-type semiconductor layer.

6. The display apparatus of claim 1, wherein the electrode connector is surrounded by a non-conductive material.

7. The display apparatus of claim 6, wherein the non-conductive material surrounds side surfaces of the insulation layer.

8. The display apparatus of claim 1, wherein light generated from the light emitting diode is emitted through the transparent substrate.

9. The display apparatus of claim 1, wherein the panel substrate comprises a plurality of TFTs.

10. The display apparatus of claim 1, wherein the panel substrate comprises a circuit for an active matrix drive or a passive matrix drive.

11. The display apparatus of claim 1, wherein the transparent substrate is insulation substrate.

12. The display apparatus of claim 11, wherein the transparent substrate is a sapphire substrate.

13. The display apparatus of claim 1, wherein the second electrode is wider than the first electrode electrically connected thereto.

14. A display apparatus, comprising:
a panel substrate;
a plurality of light emitting diodes disposed on the panel substrate;
insulation layers disposed directly on and covering side surfaces of the light emitting diodes, respectively;
first connection electrodes electrically connected to the light emitting diodes and disposed on the insulation layers between the insulation layers and the panel substrate;
second connection electrodes on the panel substrate; and
electrode connectors electrically connecting the first connection electrodes to the second connection electrodes,
wherein each of the first connection electrodes has an overlapping portion overlapping with a corresponding light emitting diode and a non-overlapping portion laterally extending from the overlapping portion on the insulation layer.

15. The display apparatus of claim 14, wherein each of the insulation layer has a width larger than a width of the first connection electrode disposed thereon.

16. The display apparatus of claim 15, wherein the first insulation layers have flat surfaces and the non-overlapping portions are disposed on the flat surfaces of the insulation layers.

17. The display apparatus of claim 14, further comprising a transparent substrate transmitting light from a light emitting diode.

18. The display apparatus of claim 14, wherein the light emitting diodes are configured to emit blue, green or red light.

19. The display apparatus of claim 14, wherein each of the second electrodes is wider than the first electrode electrically connected thereto.

20. The display apparatus of claim 14, wherein the panel substrate comprises a circuit for an active matrix drive or a passive matrix drive.

* * * * *